United States Patent
Fasig et al.

(10) Patent No.: US 11,300,616 B2
(45) Date of Patent: Apr. 12, 2022

(54) SYSTEMS AND METHODS FOR NON-INVASIVE CURRENT ESTIMATION

(71) Applicant: Mayo Foundation for Medical Education and Research, Rochester, MN (US)

(72) Inventors: Jonathan L. Fasig, Rochester, MN (US); Christopher K. White, Rochester, MN (US); Chad M. Smutzer, Rochester, MN (US); Michael J. Degerstrom, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 242 days.

(21) Appl. No.: 16/629,518

(22) PCT Filed: Jul. 11, 2018

(86) PCT No.: PCT/US2018/041632
§ 371 (c)(1),
(2) Date: Jan. 8, 2020

(87) PCT Pub. No.: WO2019/014341
PCT Pub. Date: Jan. 17, 2019

(65) Prior Publication Data
US 2021/0132148 A1    May 6, 2021

Related U.S. Application Data

(60) Provisional application No. 62/531,428, filed on Jul. 12, 2017.

(51) Int. Cl.
*G01R 31/00*     (2006.01)
*G01R 31/3183*   (2006.01)
*G01R 31/319*    (2006.01)

(52) U.S. Cl.
CPC .......... *G01R 31/318357* (2013.01); *G01R 31/31924* (2013.01)

(58) Field of Classification Search
USPC .................................. 324/683, 750
See application file for complete search history.

(56) References Cited

U.S. PATENT DOCUMENTS

| | | | |
|---|---|---|---|
| 5,946,482 A | 8/1999 | Barford | |
| 2004/0100248 A1* | 5/2004 | Mende | G01R 15/185 324/117 H |

(Continued)

FOREIGN PATENT DOCUMENTS

| | | |
|---|---|---|
| EP | 2365345 A2 | 9/2011 |
| JP | 2003168335 A * | 6/2003 |

(Continued)

OTHER PUBLICATIONS

Agilent Technologies. (2000). Agilent 54753A and 54754A TDR Plug-in Modules. Version accessed Jun. 26, 2013. Available online at http://web.archive.org/web/20130626171430/http://cp.literature.agilent.com/litweb/pdf/54753-97015.pdf.

(Continued)

*Primary Examiner* — Brian Ngo
(74) *Attorney, Agent, or Firm* — Quarles & Brady LLP; Yakov S. Sidorin

(57) ABSTRACT

A technique for non-invasively assessing current drawn by a device under test (DUT) by monitoring a supply voltage to the DUT. Frequency data for the DUT may be generated and used to form a current estimation model. First and second voltages are simultaneously measured using first and second test probes electrically connected to the DUT, while the first test probe is connected at a current source, and while the second test probe is connected at a DUT load that is configured to draw current from the current source. The current drawn by the DUT is then assessed by applying the (Continued)

current estimation model to the measured first and second voltages. In one case, the current drawn by the DUT is estimated without insertion of a circuit component into the DUT or extraction of a circuit conductor from the DUT.

15 Claims, 16 Drawing Sheets

(56) References Cited

U.S. PATENT DOCUMENTS

| | | | | |
|---|---|---|---|---|
| 2012/0112774 | A1* | 5/2012 | Ashton | G01R 27/2605 324/683 |
| 2015/0213171 | A1 | 7/2015 | Gullapalli | |

FOREIGN PATENT DOCUMENTS

| | | | | |
|---|---|---|---|---|
| JP | 2007235363 | A | | 9/2007 |
| JP | 2008053617 | A | | 3/2008 |
| JP | 5767673 | B2 | * | 8/2015 |
| JP | 2017069904 | A | * | 4/2017 |

OTHER PUBLICATIONS

Agilent Technologies. "De-embedding and Embedding S-Parameter Networks Using A Vector Network Analyzer, Application Note 1364-1", 2004 by Agilent Technologies Inc., [Online], Available: http://anlage.umd.edu/Microwave%20Measurements%20for%20Personal%20Web%20Site/5980-2784EN.pdf.

Agilent Technologies. "De-embedding Techniques in Advanced Design System", 2008 by Agilent Technologies Inc., [Online], Available: http://literature.cdn.keysight.com/litweb/pdf/5989-9451EN.pdf.

Agilent Technologies. "S-parameter Simulation and Optimization", 2009 by Agilent Technologies Inc., [Online], Version accessed on Dec. 13, 2016. Available at http://web.archive.org/web/20161213091933/https://www.utdallas.edu/~rmh072000/Site/Software_and_Links_files/5A_slides.pdf.

Anritsu. "Simulated Removal & Insertion of Fixtures, Matching and Other Networks", 2002 by Anritsu Corp., [Online], Available: https://dl.cdn-anritsu.com/en-us/test-measurement/files/Application-Notes/Application-Note/11410-00278B.pdf.

Daniel, E. S. et al, "Network Analyzer Measurement De-embedding Utilizing a Distributed Transmission Matrix Bisection of a Single THRU Structure", 63rd ARFTG Conference Digest Spring 2004, p. 61-68.

Frickey, D. A., "Conversions Between S, Z, Y, h, ABCD, and T Parameters which are Valid for Complex Source and Load Impedances", IEEE Transactions on Microwave Theory and Techniques, vol. 42, No. 2, Feb. 1994.

Glotic, A., et al. "Determining a gas-discharge arrester model's parameters by measurements and optimization." IEEE transactions on power delivery 25.2 (2010): 747-754.

Gustavsen B. et al, "A robust approach for system identification in the frequency domain," IEEE Transactions on Power Delivery, vol. 19, No. 3, pp. 1167-1173, Jul. 2004.

Gustavsen B. et al, "Enforcing passivity for admittance matrices approximated by rational functions", IEEE Transactions on Power Systems, vol. 16, No. 1, pp. 97-104, Feb. 2001.

Gustavsen B. et al. "Rational approximation of frequency domain responses by vector fitting." IEEE Transactions on power delivery 14.3 (1999): 1052-1061.

Gustavsen B., "Computer code for rational approximation of frequency dependent admittance matrices", IEEE Trans. Power Delivery, vol. 17, No. 4, pp. 1093-1098, Oct. 2002.

Halliday, D. & Resnick, R., "Physics Parts I and II", © 1960 by John Wiley & Sons, Inc., p. 770.

International Searching Authority. International Search Report and Written Opinion for application PCT/US2018/041632, dated Nov. 22, 2018.

Keysight Design Software. How to Design for Power Integrity: Measuring, Modeling, Simulating Capacitors and Inductors, YouTube video [Online]. Uploaded Nov. 7, 2016. Available: https://www.youtube.com/watch?v=N4K3y4l4sKA&feature=youtu.be.

Keysight Technologies. (2015). Keysight N7020A Power Rail Probe User's Guide. Accessed online on Oct. 20, 2016. Available at http://web.archive.org/web/20161020101040/http://literature.cdn.keysight.com/litweb/pdf/N7020-97002.pdf.

Keysight Technologies. "Performing Nominal Optimization", ADS Support Documentation, [Online], Version accessed Jan. 3, 2019. Available online at: https://web.archive.org/web/20190103160140/http://edadocs.software.keysight.com/display/ads2009/Performing+Nominal+Optimization.

Keysight. "Keysight N7020A Power Rail Probe User's Guide Fourth Edition", 2017 Keysight Technologies Inc., [Online], Available: http://literature.cdn.keysight.com/litweb/pdf/N7020-97003.pdf?id=2535025.

K-Sim online component model generator, [Online], Version accessed Jun. 15, 2017. Available online at http://web.archive.org/web/20170614093926/http://ksim.kemet.com/.

Murata SimSurfing Design Tool, [Online], Version accessed Jun. 6, 2017. Available online at http://web.archive.org/web/20170606123935/https://www.murata.com/en-us/tool?intcid5=com_xxx_xxx_cmn_nv_xxx.

Nassif, A. B., et al. "Measurement-based approach for constructing harmonic models of electronic home appliances." IET generation, transmission & distribution 4.3 (2010): 363-375.

Novak, I. (2000). Measuring MilliOhms and PicoHenrys in Power-Distribution Networks. DesignCon2000, (pp. http://www.electricalintegrity.com/Paper_download_files/DC00_MeasuringMiliohms.pdf).

Novak, I. (2011). DC and AC Bias Dependence of Capacitors. DesignCon2011, (pp. http://www.electrical-integrity.com/Paper_download_files/DC11_13-TH2Paper_Novak.pdf).

Park, H. H., et al. "Estimation of power switching current by chip-package-PCB cosimulation." IEEE Transactions on Electromagnetic Compatibility 52.2 (2010): 311-319.

Potter, J. et al, "Theory of Networks and Lines", © 1963 by Prentice-Hall Inc., p. 11.

Pupalaikis, P., et al, "Current Sharing Measurements in Multi-Phase Switch Mode DC-DC Converters", EDICon 2017, [Online], Available: http://www.electrical-integrity.com/Paper_download_files/EDICon2017-PAPER_current-sharing.pdf.

Tasker, P. J. "Conventional transistor non-linear model extraction/verification using time domain microwave waveform measurements." 58th ARFTG Conference Digest. vol. 40. IEEE, 2001.

TDK. Selection Assistant of TDK Components, [Online], Version accessed Jul. 15, 2015. Available: http://web.archive.org/web/20150718231032/https://product.tdk.com/en/technicalsupport/seat/index.html.

Wikipedia, "State-space representation—Wikipedia, the free encyclopedia," 2017. Version as of Aug. 6, 2017. Available online at https://en.wikipedia.org/w/index.php?title=State-space_representation&type=revision&diff=794141240&oldid=790777215.

* cited by examiner

```
PDNDUTandprobes.y2p - Notepad
FILE  EDIT  FORMAT  VIEW  HELP
!! Created Tue Jan 17 22:14:14 2017
# hz Y ri R 1
! 2 Port Network Data from SP1.SP block
! freq reY11 imY11 reY21 imY21 reY12 imY12 reY22 imY22
0.00000000000000e+000   9.224424638427871e+000   -5.209981576516088e-013   -9.224309464264687e+000    5.209945248840
1.000000000000000e-001  9.224424640733345e+000    5.803465361156895e-004   -9.224309462372640e-000    2.499974380279
2.000000000000000e-001  9.224424647908935e+000    1.001334410826257e-003   -9.224309461931316e+000    2.093584088831
3.000000000000000e-001  9.224424654698915e+000    1.698825359064865e-003   -9.224309450062473e+000    1.172132591951
4.000000000000000e-001  9.224424673822385e+000    2.004803820569383e-003   -9.224309451675763e+000    4.165811665114
5.000000000000000e-001  9.224424732240072e+000    2.879279683621676e-003   -9.224309450936602e+000    1.474510290369
6.000000000000000e-001  9.224424767719395e+000    3.481250583164515e-003   -9.224309461877081e+000    1.508265396560
7.000000000000000e-001  9.224424793784577e+000    4.618308880953645e-003   -9.224309428124077e+000   -3.808818818396
7.99999999999999e-001   9.224424859873007e+000    4.845344954770976e-003   -9.224309453976750e+000   -2.576015670992
8.99999999999999e-001   9.224424923794162e+000    5.371342426052684e-003   -9.224309456786488e+000    7.677319619457
9.99999999999999e-001   9.224424974608900e+000    5.718450922049014e-003   -9.224309463346621e+000    3.350108455642
1.10000000000000e+000   9.224425047099651e+000    6.558961390121491e-003   -9.224309444091858e+000    9.984634642904
1.20000000000000e+000   9.224425115368380e+000    7.054183356722060e-003   -9.224309432910019e+000    2.099706153947
1.30000000000000e+000   9.224425196431227e+000    7.512172179978995e-003   -9.224309434365074e+000    3.573282847826
1.40000000000000e+000   9.224425300881311e+000    8.197468936860965e-003   -9.224309438338754e+000    2.773776925238
1.50000000000000e+000   9.224425406380076e+000    8.864627892588356e-003   -9.224309438168474e+000    2.155646122333
1.60000000000000e+000   9.224425510516912e+000    9.401410539863923e-003   -9.224309437347483e+000    2.841283288147
1.70000000000000e+000   9.224425601856266e+000    9.837818622405448e-003   -9.224309424815131e+000    4.530670255993
1.80000000000000e+000   9.224425681691980e+000    1.029125601882905e-002   -9.224309401027510e+000    6.049756209573
1.90000000000000e+000   9.224425874689480e+000    1.117680423849568e-002   -9.224309407031194e+000    3.247732763611
2.00000000000000e+000   9.224425974740424e+000    1.163810628878960e-002   -9.224309417750520e+000    4.688175945267
2.10000000000000e+000   9.224426126196965e+000    1.224264600957303e-002   -9.224309423980717e+000    4.696239621505
```

FIG. 8

SYSTEMS AND METHODS FOR NON-INVASIVE CURRENT ESTIMATION

CROSS-REFERENCE TO RELATED APPLICATIONS

This application is a U.S. national phase of the International patent application No. PCT/US2018/041632 filed on Jul. 11, 2018 and titled "Systems and Methods for Non-Invasive Current Estimation," which claims priority from the U.S. Provisional Patent Application Ser. No. 62/531,428 filed on Jul. 12, 2017. The disclosure of each of the above identified patent applications is incorporated by reference herein.

STATEMENT REGARDING FEDERALLY SPONSORED RESEARCH

This invention was made with government support under grant SPPDG-13-D-0123 awarded by the Department of Defense. The government has certain rights in the invention.

FIELD OF THE INVENTION

This document concerns a disclosure relating generally to estimating electrical current for applications in which measurement is difficult or impractical and more specifically, to measuring supply current to devices, such as an application-specific integrated circuits (ASICs), field-programmable gate arrays (FPGAs), or central processing units (CPUs), without also affecting the instantaneous supply voltage and compromising the operation of the device.

BACKGROUND

It is known to be notoriously difficult or impractical to measure instantaneous supply current to a device such as an ASIC, FPGA, or CPU without also affecting the instantaneous supply voltage and compromising the operation of the device. As a result, for decades designers have relied on crude estimates of dynamic load-currents that stimulate a designed power delivery network (PDN). The consequences of such inevitably inaccurate load-current characterization can range from excessive PDN cost and lengthened development schedules to poor performance or functional failure.

Printed circuit boards (PCBs) can include a power delivery network (PDN), containing, for example, the board along with many capacitors for each load, for bringing power from a supply to the loads. In one example, a PCB may contain voltage regulators and loads.

The measurement of current provided by power supply circuitry is very challenging, especially in the case of dense printed circuit boards. The low voltage levels used by today's processors makes the insertion of a current measurement structure within the dense PCB nearly impossible. As a result, the current supplied to the large loads cannot be measured directly, for all practical purposes. For example, the circuit board does not provide a place to break the circuit embedded in the board for insertion of a current sense resistor so that supply current can be determined according to Ohm's law. Similarly, it proved to be impractical to remove conductors out of the board for placement into a current probe to determine supply current according to Ampere's law.

Thus, there remains a strong need for a non-invasive approach to estimating current through a device without interfering with the operation of the device resulting from insertion and removal of components or conductors from the device.

SUMMARY

The following description make references to the accompanying generally not to scale drawings, in which several implementations of the idea of the invention are shown but as non-limiting examples, which do not necessarily represent the full scope of the invention.

Examples of embodiments, systems and methods discussed below provide illustrations to methodology of precise determination of time-domain current waveforms based on a pair of empirically-acquired, experimentally-measured time-domain voltage waveforms. A Non-Invasive Current Estimation (NICE) approach, discussed in this disclosure, may employ a frequency-domain model and then use it to determine actual, tangible time-domain waveforms for the currents in a circuit. This model, along with measured voltage waveforms, may alternatively or additionally be used to generate current waveforms that were proven to be practically impossible to derive by other means, as related art shows.

According to one configuration, a method is provided for non-invasively estimating current drawn by a device under test (DUT). The method includes measuring first and second voltages (or, in a related case, measuring first and second currents) using first and second test probes electrically connected to the DUT. The first test probe is connected at a current or power source and the second test probe is connected at a load in the DUT, where the load is configured to draw current from the current source. Empirical frequency data (in one example, voltage frequency data) is generated for the DUT by measuring the first and second voltages over a selected range of frequencies and a current estimation model is then generated by fitting a function to this empirical frequency data. Alternatively, empirical frequency data is generated for the DUT by measuring first and second currents over the selected range of frequencies. A skilled artisan will readily appreciate that overall the empirical frequency data is generated for the DUT as a result of measurement, over the chosen range of frequencies, of first and second electrical parameters each of which is defined by the presence and/or movement of electrical charge(s) in the electrical circuitry of the DUT. A report is then created based upon the current drawn by the DUT that contains data enabling a user to perform at least one of redesigning, rebuilding (i.e., physically transforming), testing, and debugging the DUT.

According to a related specific configuration described here, a method is provided for non-invasively estimating current drawn by a device under test (DUT). The method includes assessing first and second voltages at first and second test locations that are simulated as electrically connected to the DUT. The first test location is located at a current source and the second test location is located at a load in the DUT, where the load is configured to draw current from the current source. Simulated voltage frequency data is generated for the DUT by estimating the first and second voltages over a selected range of frequencies and a current estimation model is generated by fitting a function to this simulated voltage frequency data. A report is then created based upon the current drawn by the DUT where data contained in the report enables a user to perform at least one of redesigning, rebuilding, testing, or debugging the DUT.

BRIEF DESCRIPTION OF THE DRAWINGS

The invention will be more fully understood by referring to the following Detailed Description of Specific Embodiments in conjunction with the not-to scale Drawings, of which:

FIG. 8 depicts an example output from one embodiment of the disclosure.

Figure 1:
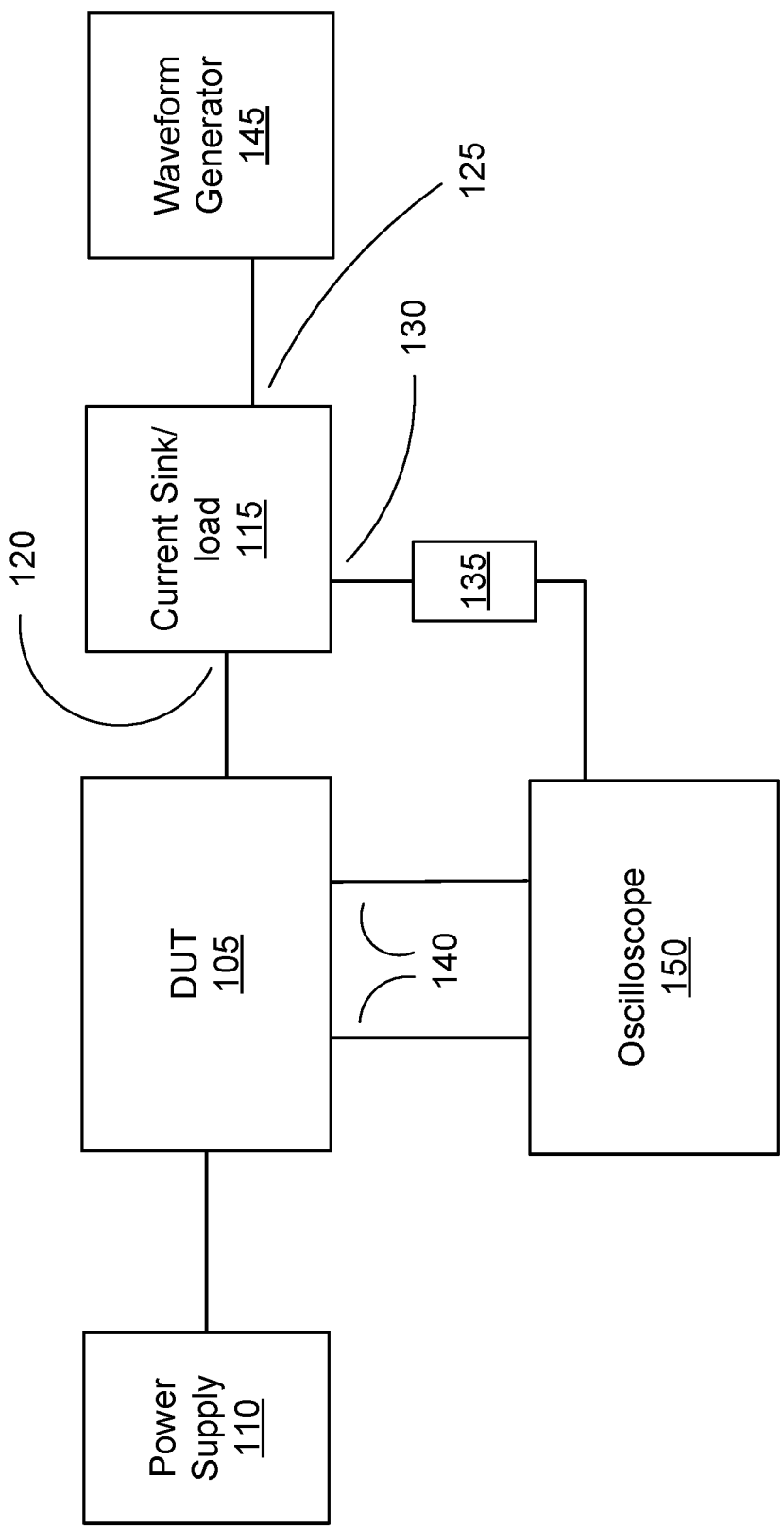
FIG. 1 is a block-scheme of a hardware arrangement representing one embodiment of the present disclosure.

Generally, the sizes and relative scales of elements in Drawings may be set to be different from actual ones to appropriately facilitate simplicity, clarity, and understanding of the Drawings. For the same reason, not all elements present in one Drawing may necessarily be shown in another.

DETAILED DESCRIPTION

According to one configuration of the disclosure, the NICE methodology and the associated hardware system combine existing network theory, mathematical operations, and control theory to solve one of the toughest problems currently facing PCB testing—the observation of the load current. The output and outcome(s) formed as a result of the operation of the NICE system and/or method are intended to and do enhance the ability to design, build, test, and debug complicated power delivery networks for next generation of low-voltage (1.0V or less in one embodiment, 0.5V in one embodiment, or 0.1V or less in another embodiment, for example), high-current (100 A or more in one embodiment, 150 A or more in one embodiment, or 200 A or more in another embodiment, for example) electronics by providing the user with a report of the current used by a device under test (DUT). This report may be a graphical display of the current waveform, or may be a tabulated list of current values or other form of display that the user finds useful. As examples, redesigning a PCB network includes changing the components in the PCB network such that additional or different components may be added or some components may be removed. The PCB design may be modified such as to move the DUT spatially closer or farther away from other components on the common substrate, such as on the board. Rebuilding or physically transforming a PCB network may be performed by replacing components necessary to fix issues, such as by replacing damaged components, replacing incorrectly attached components or to repair damage in the PCB. Test data may be recorded and stored for further evaluation or for documentation purposes. DUT testing may also provide a quality metric to assess whether the hardware meets specifications. Debugging may be performed when the current waveform indicates a problem is occurring in the load. Debugging will also identify when too much or insufficient current is being consumed by the load which correlates to incorrect circuit performance inside the load. Other examples include when a user may change a circuit design to be more power efficient after receiving a NICE report indicating the current that is or would be used by the DUT would be higher than the desired design specifications, or a user may flag a circuit board as defective after receiving a NICE report that the circuit failed to provide the desired current consumption performance metric, or a user may identify and debug a specific circuit failure point (such as a short or an open) with a NICE report. Many other examples of when a user may find a NICE report useful are envisioned.

In some embodiments, the presented NICE methodology employs a frequency-domain model and uses it to determine time-domain waveforms for the currents flowing in a circuit during its operation. This model, along with measured voltage waveforms, are then used to generate current waveforms the derivation of which with any other means—as is well known from related art—remain a rather elusive goal and is practically impossible. Network theory has broad applicability within the field of electrical engineering and particularly within the area of circuit design. The basis of the network theory, applied to the current problem, is that information obtained at each of the ports connected to a network can describe the network itself. In one embodiment, the NICE algorithm includes the use of a multi-port (for example, 2-port) admittance network framework, while in a related embodiment any number of ports may be used. The admittance network model allows for the calculation of current at any port if all of the port voltages and network parameters are known. As shown in equation (1), the relationship between the port currents and port voltages using a 2-port admittance network are related by the admittance matrix. This equation holds for currents, voltages, and admittance parameters in the frequency domain for linear networks.

$$\begin{bmatrix} I_1 \\ I_2 \end{bmatrix} = \begin{bmatrix} Y_{1,1} & Y_{1,2} \\ Y_{2,1} & Y_{2,2} \end{bmatrix} \begin{bmatrix} V_1 \\ V_2 \end{bmatrix} \quad (1)$$

Applying equation (1) to an example case of the "Pi" network where 3 resistors (a, b, and c) are all connected together and where $Y_a=1/Z_a$, $Y_b=1/Z_b$, and $Y_c=1/Z_b$, it can be shown that $Y_{11}=Y_a+Y_b$, $Y_{12}=-Y_b$, $Y_{21}=-Y_b$, and $Y_{22}=Y_c+Y_b$. Network Y-parameters are defined by application of a short-circuit condition at one of the network ports. This condition gives rise to the common moniker "short-circuit admittance parameters" applied to $Y_{11}$, $Y_{12}$, $Y_{21}$, and $Y_{22}$. The transfer admittance values ($Y_{12}$ and $Y_{21}$) always equal $-Y_b$ (or $-1/Z_b$) for the Pi network.

In an alternative to the Pi Network example, there exists a companion set of "open-circuit impedance parameters" commonly identified as $Z_{11}$, $Z_{12}$, $Z_{21}$, and $Z_{22}$ that are defined by application of open-circuit conditions at one of the ports. The analogous special case for Z-parameters is the "T" network. While the development of Y- and Z-parameters and methods greatly simplified many engineering tasks, microwave transmitter designers quickly learned that their creations reacted adversely when shorts and opens were applied to the output, often destroying or disabling the transmitter being tested. Moreover, true "shorts" and true "opens" were difficult or impossible to realize because the effects of parasitic inductance and capacitance become significant at microwave frequencies. To mitigate these issues, scattering (S) parameters were developed to facilitate characterization of networks by connecting a known finite impedance (typically 50 ohms) to the affected port.

The equations for $Y_{11}$ through $Y_{22}$ shown above are valid at all frequencies, but that $Y_a$, $Y_b$, and $Y_c$ may be functions of frequency themselves. For a typical power delivery network, $Y_a$ is the total admittance of several capacitors in parallel and likewise for $Y_c$. $Y_b$ is the admittance of the conductor resistance and path inductance of the printed wiring board or other interconnect elements. Consequently, except for the case where frequency is zero (DC), $Y_a$, $Y_b$, and $Y_c$ are complex numbers and the rules for complex algebra must be observed. Except for very simple networks with just a few components, the manual calculation of Y-parameters can become laborious and various analysis tools and instruments are employed to facilitate the task. Fortunately, Y-parameter values can be calculated from scattering (S) parameter data and S-parameter component models are available.

Power delivery networks contain many components, and they will have a very low impedance by design. For complex PCBs, the power delivery network can be analyzed using lab measurements or electromagnetic simulators. The network is then represented in the frequency domain. The standard method for recording the frequency domain network parameters is in a Touchstone file. This standardized file format expresses each network parameter ($Y_{m,n}$) as vectors (e.g. magnitude and phase) at specific frequencies.

Equation (1) can be used to calculate the port currents from the port voltages. However, the port voltages are often measured in the time domain and more intensive math is required to solve for the port currents from time domain data. The multiplication of network parameters with port voltages in the frequency domain becomes a convolution in the time domain, which is a distinct advantage of working initially in the frequency domain as doing so allows for a simpler calculation when converting from the frequency domain to the time domain.

In one embodiment, an approach begins with the measured voltages being converted to the frequency domain through the Fourier transform. Then, the multiplication can proceed as prescribed in equation (1). The frequency domain solution for the currents then requires an inverse Fourier transform to convert the currents to the time domain. It is important to note that the whole voltage waveform is needed before the Fourier transform is applied. This may affect real time calculation of the port currents. Frequency domain data may be non-causal when using this method, such that errors may be introduced in the currents after the inverse Fourier transform.

In an alternative embodiment, an approach transforms the network parameters into the time domain. The network parameters are converted into the time domain using the Fourier transform and then the time domain voltages are convolved with the time domain network parameters. The transform of the network parameters only needs to be done once, but the convolutions are also computationally intensive and will need to be run for every waveform capture. The convolution requires a complete voltage waveform just as the Fourier transform did in the previously described method. A number of numerical errors can arise during the inverse Fourier transform of the network parameters if care isn't taken to prevent such errors. Again, non-causal parameter values can cause numerical errors.

In an alternative embodiment, an approach to indirect current calculations is to replace the network parameters with rational functions that approximate them in the frequency domain. There are many rational fitting methods that could be used in this approach, including vector fitting. The rational vector fitting method is a numerical method for rational approximation in the frequency domain using poles and residues. It permits generating multi-port models directly from measured or computed frequency responses by finding the optimal poles and residues to approximate the frequency domain data. In Equation (2), the function of a rational function with poles $a_n$ and residues $c_n$ is defined. The goal of the vector fitting is to equate each element of the Y matrix to a function f(s).

$$f(s) = \sum_{n=1}^{N} \frac{c_n}{s - a_n} + d + s \times h \qquad (2)$$

Where d is a constant that represents a fixed amount of time delay, h is a "zero" that can be considered as the opposite of a pole. The vector fitting approach is described in literature known in the industry, such as B. Gustaysen and A. Semlyen, "Rational approximation of frequency domain responses by vector fitting," *Power Delivery, IEEE Transactions on*, vol. 14, pp. 1052-1061, 1999; available at ieeexploreleee.org/xpl/articleDetails.jsp?arnumber=772353, which is herein incorporated by reference.

There are numerous benefits to a rational vector fit of the Y matrix elements. First, the numerical representation is generally more compact than a tabular format. Second, the rational functions can readily be converted to the time domain without the limitations of the Fourier methods. Third, the rational functions are guaranteed to be causal by design—all complex poles must occur in conjugate pairs. This is important, because one complication of the inverse Fourier transform was non-causal results. Fourth, the function can quickly be tested and corrected to maintain passivity (if that is a requirement). Each benefit improves accuracy or calculation speed for the current waveforms.

In one embodiment, state space modeling may be used. In state space modeling, a linear system is represented by four matrices: A; B; C; D The matrices are the same for the frequency domain (3, 4) or the time domain (5, 6). Therefore, if the matrices are created for a frequency domain system, the time domain system is also known. The time/frequency duality is how NICE leverages the rational function approximation to time domain calculations from frequency domain system models.

The inputs of the system are the u(t) or U(s) variables. The x(t) or X(s) variables are the "state" of the system. The outputs of the system are the y(t) or Y(s) variables. By creating the appropriate matrices for the system, an output (current in this case) can be generated from inputs (measured voltages for NICE). And one output sample is created for each sampled inputs. Thus, once the matrices are created the calculations can run in real time passing each measurement sample to the calculation and receive the associated output sample. This eliminates the need to have a completely measured waveform before beginning the output calculation.

$$sX(s)=AX(s)+BU(s) \quad (3)$$

$$Y(s)=CX(s)+DU(s) \quad (4)$$

$$\dot{x}(t)=Ax(t)+Bu(t) \quad (5)$$

$$y(t)=Cx(t)+Du(t) \quad (6)$$

In one embodiment, the results of the vector fitting algorithm noted previously are the appropriate poles and residues as required for (2). The poles are generated in the s-plane (complex frequency domain) and the residues are calculated to best fit the Y matrix elements. Each pole can be a real or complex number. If the pole is complex, it occurs as part of a conjugate pair of poles to ensure causality. The d term is a constant, which is often zero or a real number. The h term in (2) may be zero for most cases. The conversion is a direct translation from the poles and residues to the state space matrices. The A matrix is a 2 N×2 N matrix of the poles. The B matrix is a matrix of ones and zeroes. The C matrix contains the residues that are associated with each pole. The D matrix is created from the d constants from (2). By assembling the matrices, it is possible to directly create the state space system in the time domain.

In example embodiments, NICE may be used for passive circuits. However, passivity is not a strict requirement for using NICE—only linearity and causality may be needed for certain embodiments. The poles and residues method of creating the rational function approximation to Y matrices allows direct mathematical determination of passivity. Further, it identifies where in the frequency domain the function is not passive. This information is then used to fix the poles and residues to guarantee passivity if it is desired.

One benefit of the NICE system and method is its ability to provide real time processing of voltage waveforms to generate and display current waveforms for the user (for example, forming an image on a monitor, or providing an output in another user-perceivable form, such as a visually-perceivable form or an audibly-perceivable form, for instance, a print and an audible signal being two non-limiting examples of the output representing current waveforms). The real time feedback is critical in many laboratory situations where there isn't time to wait for time-consuming offline calculations to return a result to the user, e.g. circuit bring-up or debugging. In one embodiment, the NICE real-time processing may be implemented for a Keysight MSOS404 oscilloscope. This requires the use of an executable code. A coding language with built-in functions to generate the rational poles and residues, create the state space matrices, and then calculate the current waveforms from the voltage waveforms using the state space system may be used. The implementation is not dependent on any particular coding language. Matlab, C, C++, Python and the like are all coding languages that may be used for a NICE system and method. Each operation in the algorithm may also be implemented in code using freely available (i.e. open) mathematical libraries. For the purposes of this disclosure and accompanying claims, the term "real time" or related terms are used to refer to and defined a real-time performance of a system, which is understood as performance that is subject to operational deadlines from a given event to a system's response to that event. For example, a real-time extraction of data and/or displaying of such data based on empirically-acquired signals may be one triggered and/or executed simultaneously with and without interruption of a signal-acquisition procedure.

In one embodiment, a NICE system may include the following workflow for rational function generation: 1) Read in frequency domain tabular data; 2) Generate poles and residues to approximate input data; 3) Iterate poles and residues generation until an acceptable minimum error is reached; 4) Correct for passivity (if needed); 5) Create state space model from poles and residues.

In one embodiment, a NICE system may include the following workflow for real time processing that requires interaction with test hardware. The hardware will generate voltage samples in some format. Either as raw analog-to-digital circuit (ADC) output bits or as higher level numerical equivalents, e.g. floating point numbers. The hardware then passes the sampled data to the NICE code for real time processing. These operations include: 1) Generate initial state based on first samples taken. 2) Calculate output for first samples taken. 3) Pass output data back to system. 4) Display output samples or record samples to a file. 5) Iterate steps 2-4 for each new sample saving the previous state for the next calculation.

Referring now to FIG. 1, this example configuration involves testing a device under test (DUT) 105. The setup depicted in FIG. 1 includes a source power supply 110 that features a voltage regulator and load 115, which in this particular example is a Picotest J2112 A, a voltage-controlled current sink that sinks current at the output 120 proportional to the voltage applied to the input 125 provided by an arbitrary waveform generator 145. The monitor port 130 outputs a voltage that is proportional to the current being drawn by the load 115, which is then measured by differential probe 135. This is intended to allow a comparison of the NICE-estimated current with a measured current.

Differential voltage probe 135, which may be selected to be a Keysight N7020 A probe, is used to sense the voltage at the monitor port 130. This extra apparatus is inserted to prevent ground-loops, which are current feedback paths that may introduce errors in the voltage measurements. Ground-loops may be in the form of when probes are connected to the DUT, the "ground" at one sense point is connected through the cable, probe, oscilloscope, second probe, and second cable to the second sense point. If large currents flow in the DUT ground conductors between the sense points, then a voltage difference is generated between the two ground points and this voltage difference will cause current to flow through the cables, probes and oscilloscope and potentially invalidate the measurements. A solution to the ground-loop problem may be to use a differential power-rail probe with a high common-mode input-impedance to limit the magnitude of such ground-loop currents. In other embodiments where current feedback errors are not of concern, such as when a different load 115 that isn't a J2112 A and no monitor port 130 is used, there is no connection from port 130 to the oscilloscope 150, and no path for the flow of ground-loop currents.

While any number of test points may be used with the NICE system and method, only two are depicted in this example configuration with probe cables 140 connected to test points on the DUT 105 and to oscilloscope 150. The probe cables 140 in FIG. 1 may be selected to be Keysight N7022 cables and are used to connect the DUT 105 to the probes, which may be selected to be Keysight N7020 A probes. The first test point may be selected to be a connection to the power supply net of interest (and ground plane) along the current path near the Voltage Regulator Module (VRM) from source 110. Any test location is permissible as long as that location is used in the DUT modeling; a location near the VRM may be located at the output of the VRM or as close to the output as physically or practically feasible. Attachment points may be provided by the component manufacturer and accuracy will decrease if test points are selected farther away from the VRM or DUT. A second test point may be selected to be a connection to the same power supply net (and ground) along the current path near the load 115. A location near the DUT may be selected as a location as close to the input of the load as physically or practically feasible. This connection may be made using voltage and ground (VDD & VSS) sense signals originating from inside the DUT. These signals are typically provided by ASIC designers to provide accurate feedback to a voltage regulator. If such sense signals are not available then a user may probe the supply and ground nets on the board near (as close to the input as physically or practically possible) the ASIC.

The DUT 105 shown is a PDNDUT board, a collection of capacitors with connecting copper planes and traces; this is the power delivery network that channels electrical power from the source 110 to the load 115 (a J2112 in the present example).

Figure 2:
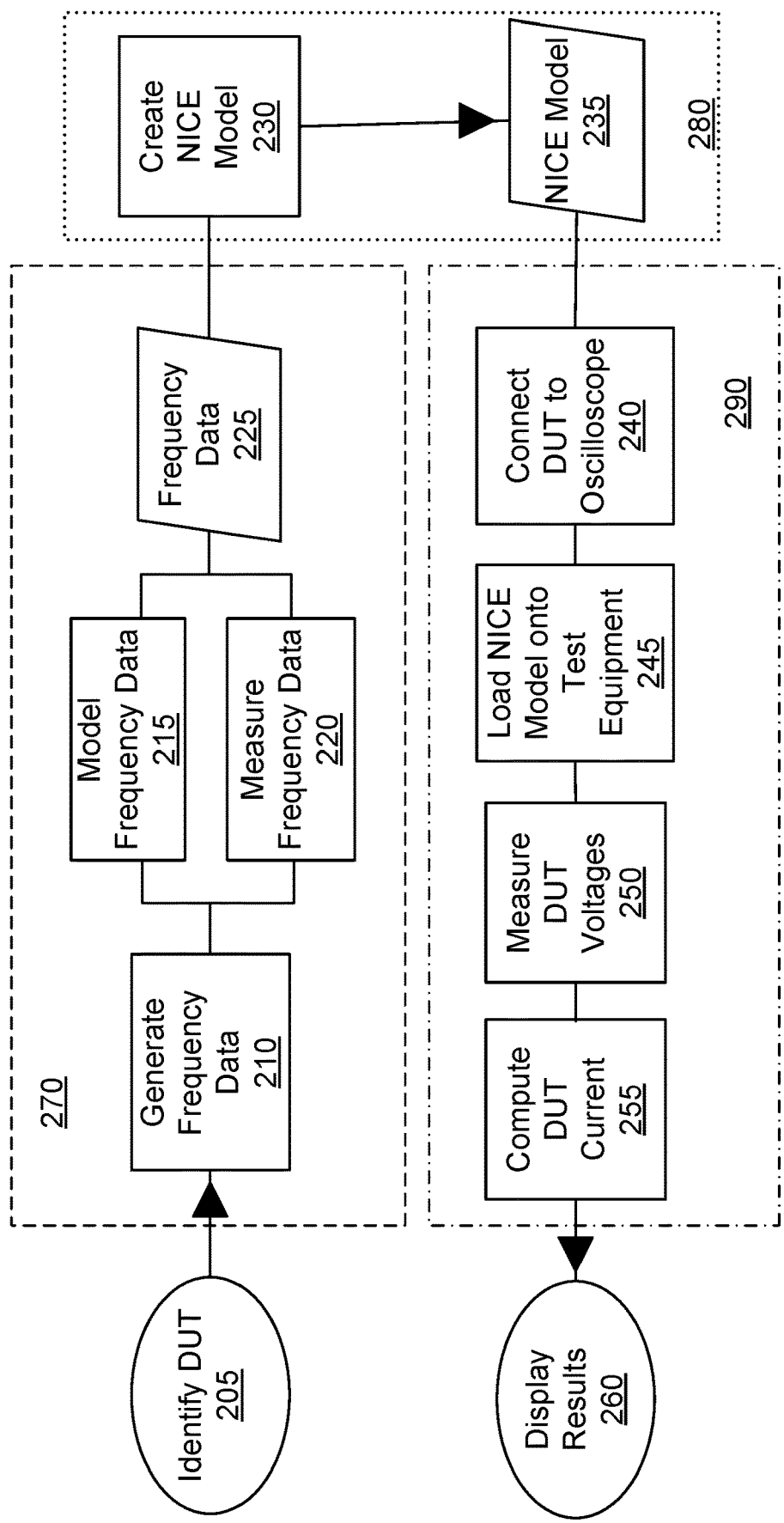
FIG. 2 is a flowchart representing an embodiment of the workflow.

Referring now to FIG. 2, a representative workflow that implements one example of the NICE methodology is shown. First, identifying a DUT step 205 isolates a circuit to be tested, and the process then enters the user operation section 270 of the workflow. In this user operation section 270, completing the generating frequency data step 210 results in a user modeling the frequency data at 215, and/or measuring the frequency data at 220. Both of these steps are explored in greater detail in FIG. 3 and FIG. 4 respectively. The resulting selected data results in frequency data 225. Frequency data 225 may be selected as entirely modeled frequency data, empirically measured frequency data, or a combination of both. Empirically measured frequency data is measured with the use of a voltage waveform. The data reported is the ratio of transmitted voltage to received voltage. Measurements may report frequency data in the form of scattering parameters (S-parameters). In simulation, modeled frequency data is calculated as electromagnetic fields. Simulations may calculate electric (E) and magnetic (H) fields, or may calculate currents and voltages. Different simulators have different approaches. Simulations may report frequency data in the form of scattering parameters (S-parameters). In one configuration, frequency data is a set of conversion ratios and is reported for either the measured or modeled case as scattering parameters which can be mathematically transformed to impedance or admittance parameters. Scattering parameters are ratios of input signal to output signal and admittance parameters convert voltages to currents. Frequency data can be scattering parameters, admittance parameters, impedance parameters, or other like formats. In one configuration, frequency data is in the form of admittance (Y) parameters. Any of the parameter formats are capable of mathematical transformation to the other formats.

Referring still to FIG. 2, an offline process of NICE code is implemented in this example in NICE offline code section 280. Frequency data 225 is used as input to create a NICE model at step 230, which results in the output of NICE model 235. NICE offline code section 280 is further detailed in FIG. 5. The NICE model 235 is then input to oscilloscope section 290 of the workflow. Here, the DUT is connected to the oscilloscope at step 240, the NICE model is loaded onto the test equipment at step 245, the DUT voltages are measured at step 250, and the DUT current is computed at step 255. Finally, the results are displayed at step 260. Additional detail for oscilloscope section 290 is provided in FIG. 6.

Figure 3:
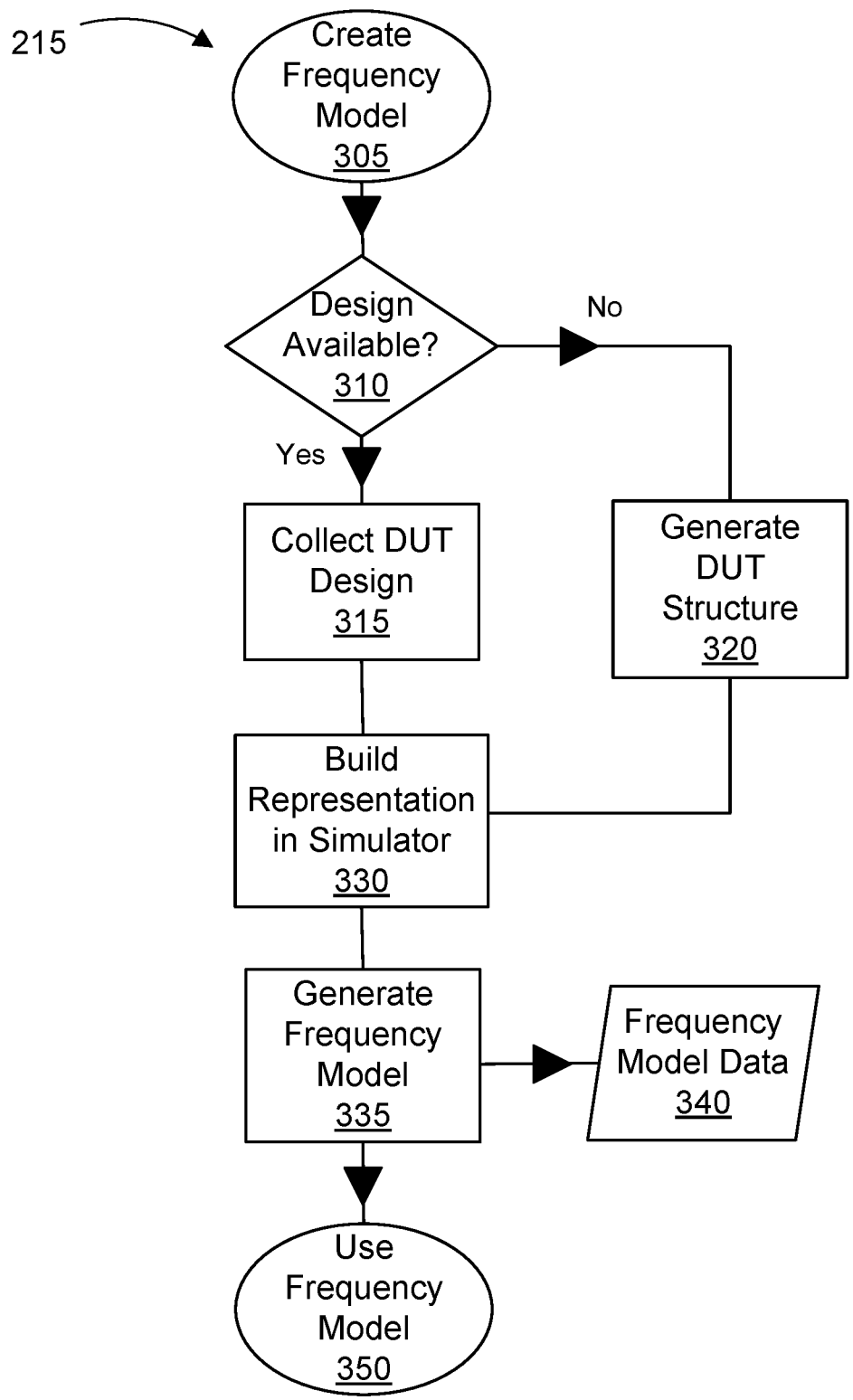
FIG. 3 is a flowchart detailing a section of the flowchart of FIG. 2.

Referring now to FIG. 3, step 215 from FIG. 2 is explored in greater detail. A frequency model is created starting at 305. If circuit design information is available, the process continues to step 315 where the DUT design information is collected and used to build a simulated representation of the DUT at 330. If no circuit design information is available at 310, then it may be necessary to generate or generalize a DUT structure at 320. This information can then also be used to create the simulation at 330. The frequency model is then generated at 335, resulting in frequency model data 340 and the output to use the model at 350.

Circuit design information may be available from various manufacturers that can be used in the method. The increasing availability of RF-aware circuit-analysis tools has motivated many component manufacturers to provide S-parameter model libraries for common components such as capacitors. At present, libraries are available from Murata, TDK, and Taiyo Yuden, and the like. Some components may have other parameters to take into account with the circuit design, such as how the effective capacitance of Multi-Layer Ceramic Capacitors (MLCC) exhibits a strong dependence on operating temperature, DC bias-voltage, and AC bias-voltage. A model may be needed for specific temperatures and DC-bias conditions, or allowance may be needed between models customized to specific temperature and DC-bias conditions. Other circuit model considerations may include taking into account the magnitude of the AC-bias (ripple voltage) across the part.

In one embodiment, a lumped-element equivalent-circuit model is used. Here, a VNA measured model is used to derive a lumped-element equivalent-circuit for any series connected component. In the case of an example PDNDUT board, a 0.100 ohm resistor may be soldered to a THRU-path substrate and the two-port VNA measurement is made. The resulting two-port S-parameter model is instantiated in a simulation (such as an ADS simulation) along with a proposed lumped element circuit (where component values are variables), an optimization controller (OPTIM), and optimization goals which describe the desired outcomes. Such goals may include, for example, defining that the lumped-element return loss should equal measured return loss; that the phase-angle of one component should equal the phase-angle of another component; that the lumped-element transmission loss should equal measured transmission loss; and the like. This same process can be used to derive lumped-element equivalent-circuit models for the other components in the circuit as well. This may be needed since measured capacitor models can appear noisy in both magnitude and phase near the self-resonant frequency of the component while lumped-element models do not suffer from such effects. Usually one begins with one resistor-inductor-capacitor (RLC) branch, optimizes that branch to the extent possible, and then adds branches until a satisfactory response is achieved.

In one embodiment following the process of FIG. 3, preparation for applying the NICE approach includes performing an EM analysis of the PDNDUT board. The goal of this analysis is to determine the network parameters for this network; this is essentially the electrical model for the DUT 105. This analysis is an extraction of network parameters by Electro-Magnetic (EM) analysis using a software tool such as Ansys Slwave, Cadence Sigrity, Keysight SI/PI-pro, and the like. These tools import a Printed Wiring Board (PWB) layout-file and use numerical methods to calculate S-parameters for selected signal nets.

The process begins by assigning a "Port" at each spot where energy enters or exits the circuit. To include the effects from circuit components, the user may assign a lumped-element (RLC) equivalent-circuit model or a Touchstone S-parameter model for each component and let the EM solver compute the overall response of the board and components. For large designs with multiple instances of a specific component, this can be effective because the EM solver can quickly apply a component model to all instances of that component. The drawback of this approach is that any component changes require a complete rerun of the EM solver, which can take multiple days. Alternatively, the user may deactivate each circuit element and assign a port for each component so that the EM solver computes only the network parameters for the PWB itself. In this case the overall response for the board and components is calculated separately using a circuit simulator. This approach requires that a component model be manually connected to each instance of component port, and this task can become tedious for designs with a large number of components. The advantage of this approach is that component changes are quickly accommodated by the circuit simulator without having to repeat a lengthy EM analysis.

The final step of the EM simulation is the generation of a Touchstone file that contains tabulated S-parameter values at each frequency point in the sweep. The EM simulation may complete a simple example involving 8 ports in 1.2 minutes on a dual-Xeon workstation with 96 GB of RAM when the "Distributed Analysis" (frequency-sweep multithreading) feature is enabled. For comparison, Slwave analysis of four power domains on a 20-layer PCIe-sized board runs for approximately 52 hours.

At this point, it is often useful to compare the EM-simulator results to some measurement to confirm that the correct dielectric thickness, permittivity, conductor thickness, and conductivity were used in the EM simulation. This may be done before the capacitor models are attached so the number of variables under consideration can be minimized.

Figure 4:
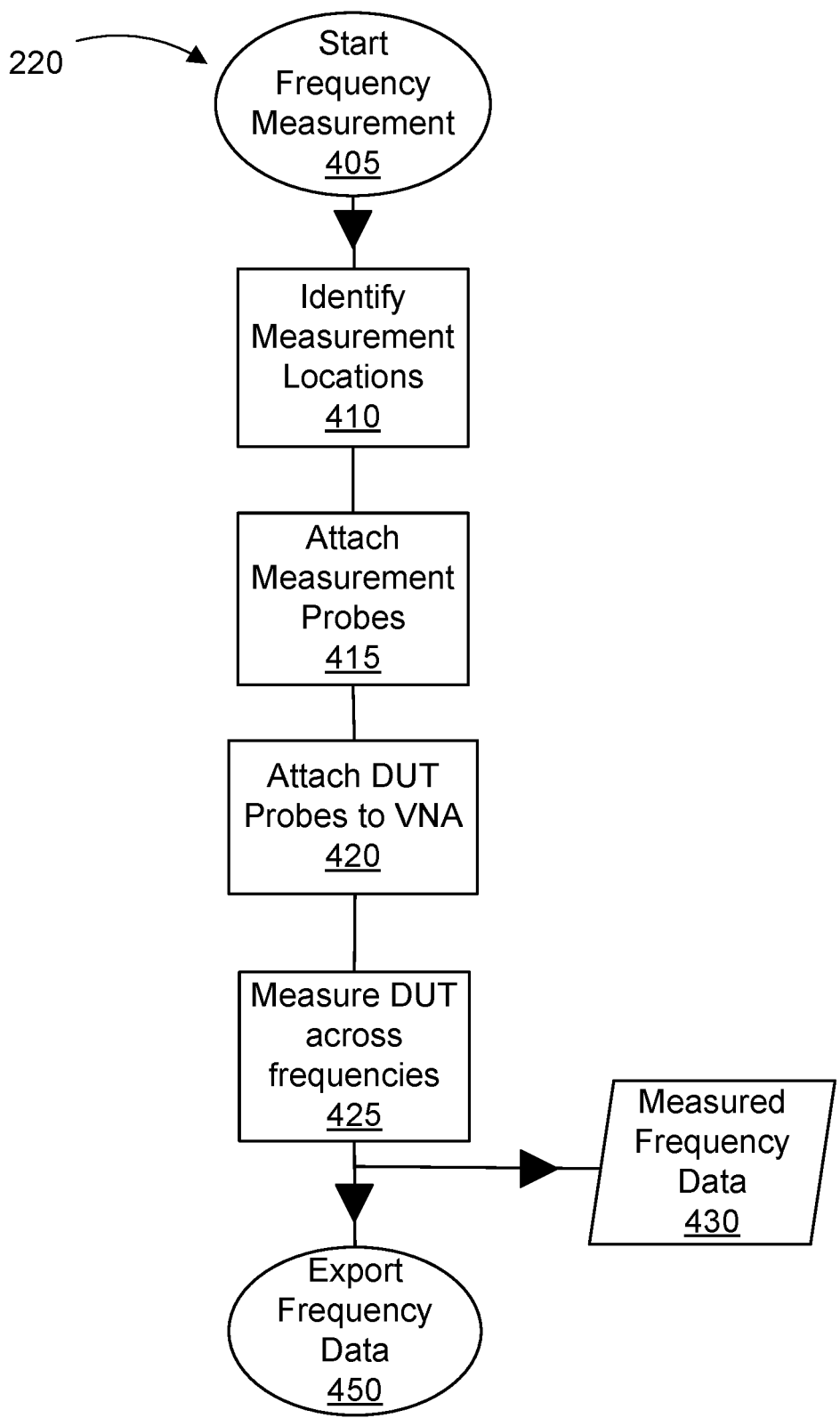
FIG. 4 depicts a flowchart detailing another section of the flowchart of FIG. 2.

Referring now to FIG. 4, step 220 from FIG. 2 is explored in greater detail. Measuring frequency data starts at 405 and the measurement locations are identified on the DUT at 410. Example test points were described previously in relation to FIG. 1. Measurement locations and probe attachments are engineering decisions that may be based on the desired measurements and physical access on the DUT. Measurement probes are attached to these locations at 415, and connected to the VNA at 420. The setup of the VNA is application and DUT dependent. Once set up, the DUT is measured across frequencies using the VNA at 425. This results in creating the measured frequency data 430, which can be exported for use at 450. The measured frequency data 430 is a tabular collection of data points where one frequency point in the table is associated with the DUT's impedance, admittance, or scattering parameters. The data may be in the form of complex numbers and may be tabulated in different formats such as magnitude and phase or real and imaginary.

In one embodiment following the process of FIG. 4, a circuit model may be obtained by direct measurement using a vector network analyzer (VNA). When measuring the DUT network parameters it is important to ensure that the DUT configuration matches the equipment setup for the voltage measurement. For power delivery network (PDN) design and analysis on printed wiring boards (PWBs) the frequency range of interest is typically DC to 100 MHz. To ensure that the network is free of resonances or other response issues, the upper limit is commonly extended as high as 1 GHz. In either case, a network analyzer may be chosen that has a broad range, such as the Agilent/Keysight E5061B which spans the range from 10 Hz to 3 GHz. A calibration kit such as the Agilent/Keysight 85033E or a calibration substrate that is compatible with the signal probes chosen is a potential complement to the network analyzer.

For a wide-range sweep the network analyzer may be configured to acquire the maximum number of points (such as 1601 points total, for example) and may use a log sweep to ensure a good measurement at the low frequency end of the sweep. To achieve a maximum accuracy, the instrument may be configured for the minimum Intermediate Frequency Bandwidth (2 Hz IFBW) at each sample frequency, which results in a sweep duration of just over 13 minutes. A low-impedance PDN may produce a mid-band insertion loss of over 90 dB. The measurement uncertainty in this condition may result in data that appear "noisy". This apparent noise can be reduced by setting the instrument to average multiple sweeps, but at 2 Hz IFBW, this approach results in very long measurements. A low-noise, high-average measurement may be beneficial when creating the rational fit model.

Before performing the calibration, the source power which corresponds to the magnitude of the signal that is injected into the DUT may be selected. To ensure that the signal transmitted through the DUT is above the noise floor of the instrument, a user may choose a high power setting such as 0 dBm or +10 dBm. If a network analyzer being used has separate receivers to span large frequency sweeps then when the received signal is large, the receiver may have non-linearity that causes an instantaneous jump in the measured magnitude and phase. A lower source power may be selected to avoid these issues. The challenge is to choose a source power that does not generate objectionable jumps at the receiver switch frequencies during THRU calibration while still providing mid-band DUT measurements that can be sufficiently averaged to cancel the noise. Settings in the −10 dBm to −20 dBm range appear acceptable. Once the VNA configuration is complete, the user may perform a complete two-port calibration to the ends of the VNA signal cables.

Referring again to FIG. 4, measurement locations are identified at 410. Basic elements like resistors and capacitors are generally simple to measure because they have only two common orientations (series or shunt) and only two pins, so there is typically little confusion regarding how to connect the part to the instrument. This cannot be said for multi-pin components such as ASICs that may have hundreds of power and ground pins that are typically connected in parallel to reduce parasitic inductance and resistance. EM-extraction tools generally allow pins with a common signal name (e.g., "GND") to be grouped together into a notional "super-node" that behaves like all the constituent pins connected in parallel. Regrettably, there is no pin-group analog for measurements because there is no way to make a zero-inductance, zero-resistance connection between pins that are separated by any physical distance. At best, the parasitics of a single pin-pair can be measured and used to construct and validate pieces of a multi-pin model, which could easily become a daunting task. Consequently, pin-groups and multi-pin devices is one area where modeling may be required rather than performing a measurement.

Either approach described in FIG. 3 or FIG. 4 provides a numerical description of the behavior of the board in terms of its network parameters. This model can be validated (that is, compared with measurements of the individual pieces) to establish the accuracy of the model. Once the board and component models are validated, the next step is to combine the individual pieces to generate a model for the board assembly with all the components. This is accomplished by adding the validated component models to the (nearly) bare-board simulation, resulting in the simulation for the board.

In one embodiment, the model for the board 105 is merged with the model for the probes 140, because the probes may affect the voltages and currents that are measured on the board 105 (and this effect may change with frequency). This provides one model that describes how this entire assembly operates. To reduce simulation time and mitigate the high-frequency oscillations, the network analyzer may be used to make a one-port measurement of the probe input return-loss and the ADS optimizer may be used to find component values for a lumped-element model that matches the measured S-parameter. The resulting lumped-element equivalent circuit, and the resulting input impedance may then be free from oscillatory behavior at high frequencies.

The result of this analysis and merged model may be, in certain configurations, a single file that represents the behavior of the DUT 105 together with the probes, see FIG. 8, for an example file output. This model may be a computer text file that contains a table of numbers. In one embodiment, the text file may be a table of Y parameters (admittances), starting at 0 Hz and the table provides real and imaginary numbers for all 4 network parameters y11 through y22. These data characterize the electrical behavior of the DUT 105 and probes at frequencies from DC (0 Hz) to 1 GHz. This text file may then be saved on the oscilloscope to facilitate creation of a rational fit file.

Figure 5:
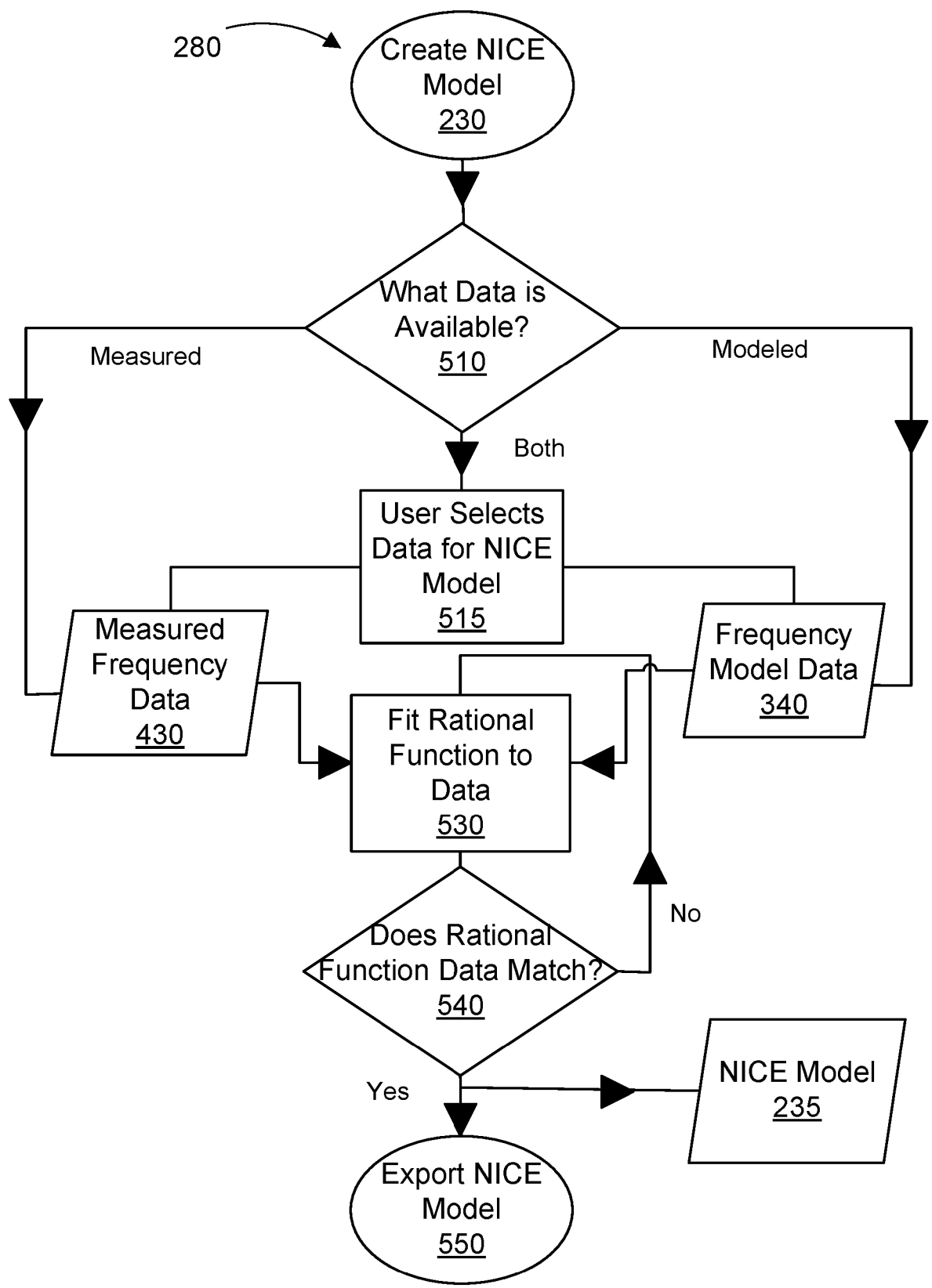
FIG. 5 depicts a flowchart detailing yet another section of the flowchart of FIG. 2.

Referring now to FIG. 5, NICE code section 280 from FIG. 2 is explored in greater detail. Creating a NICE model starts at step 230, and an assessment of what data is available for a particular DUT is performed at 510. The available data may be the measured frequency data 430, or modeled data 340, or some combination of both. The user selects the desired available data for the NICE model at 515. Selecting which data to generate the model from may be a user decision based on engineering factors, such as data frequency range considerations or how a particular data set may be best for representing the physical test points or DUT configuration. The process of selecting data may include formation of yet another data asset into which the at least a portion of the measured data and at least a portion of the measure data are transformed. In this specific example, such duly formed data set (selected data) will be combining empirical and simulated data such as voltage data. The selected data is then used to fit a rational function to the data at 530. If the rational function matches the data, then a NICE model 235 is created and exported for use at 550. If the rational function does not match the data, step 530 is repeated until a desired match is achieved. The NICE model 235 is a mathematical representation of the input data. In this implementation, a rational function is created that approximates the input data at 530. The model is optimized to match the input data at the provided frequencies. The model can then generate data for any range of frequencies. Also, the model can readily be used to create time domain data.

As an example rational function model, in the function below the N(f) and D(f) functions are polynomials with frequency, f, as the independent variable. And the order of N(f) is less than the order of D(f).

$$Z(f) = \frac{N(f)}{D(f)} \tag{7}$$

The rational function model is a mathematical representation of the frequency data previously obtained. The model may be a frequency domain or time domain representation. In one example embodiment, the rational function is a pole-residue function and may be selected so that the rational function can be directly converted to a time domain function.

Figure 6:
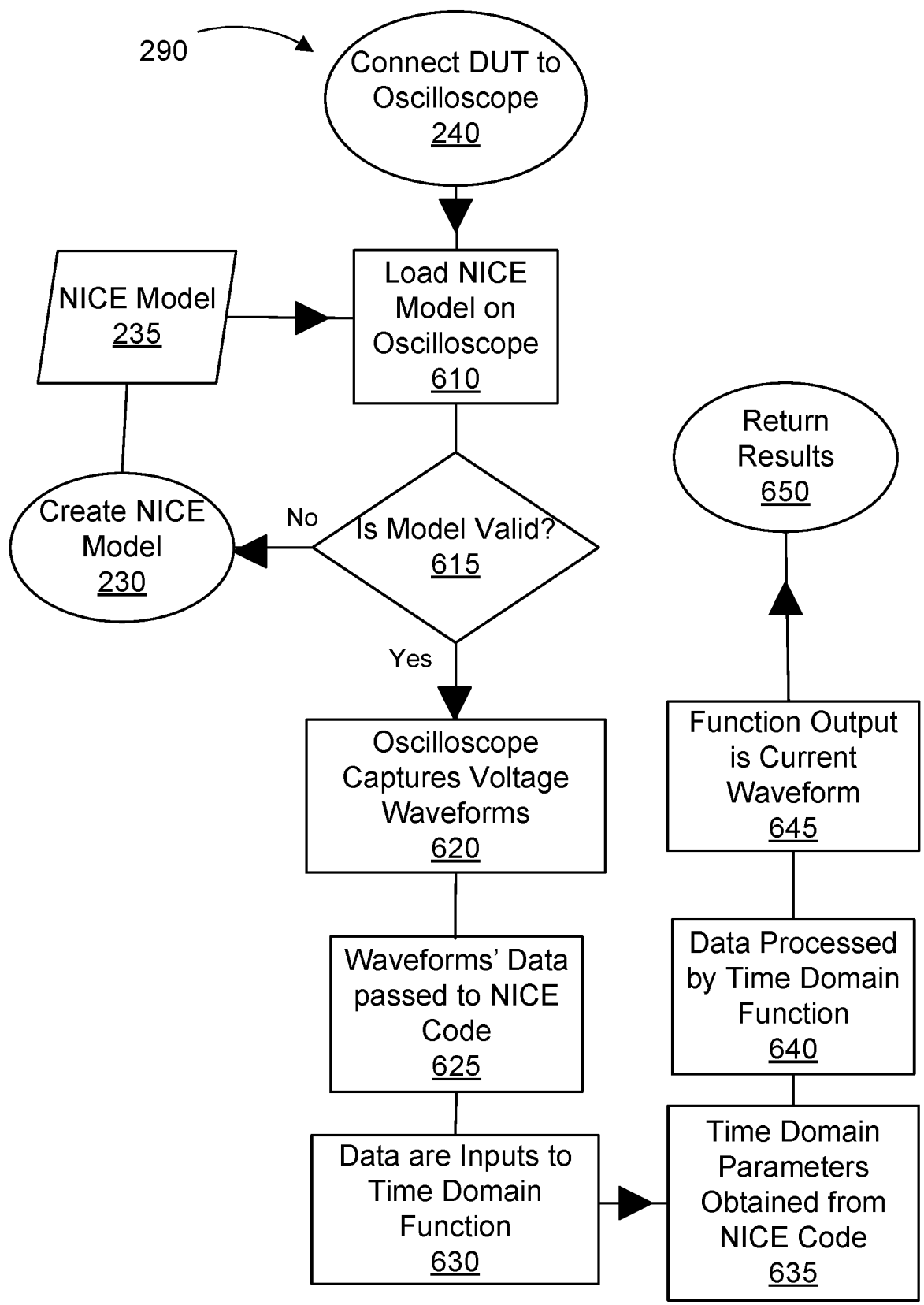
FIG. 6 depicts a flowchart with details of an identified portion of the flowchart of FIG. 2.

Referring now to FIG. 6, one embodiment for the oscilloscope section 290 from FIG. 2 is explored in greater detail. First, the DUT is connected to the oscilloscope at 240. The NICE model is loaded on the oscilloscope at 610 and the user selects whether the model is valid or not. IF the model is not valid, the NICE model is recreated as shown with steps 230 to 235 and as described in FIG. 5, and is then reloaded at step 610. If the model is valid, the process continues to where the oscilloscope captures the voltage waveforms at 620 from the DUT. This waveform data is passed to the NICE code at 625 and this forms the input to the time domain function at step 630. Time domain parameters are obtained at 635 and the data are processed by the time domain function at 640. Finally, the function output is the current waveform for the DUT at 645, which returns the results at 650. These results are displayed per step 260 from FIG. 2.

In one embodiment, the time domain function of the code uses state space methods. For this embodiment, the NICE model represents coefficients within the function. The data are the dependent variables. The time and input data are used with the NICE coefficients to calculate the current. The calculation is executed for each time step. By using the fastest method, the operation can be performed in real time giving the user immediate feedback. Alternative time domain calculations can also be done that are not dependent upon state space methods.

The rational fit model may, in various implementations, be performed using an oscilloscope or another computing device (such as a desktop computer, a mobile device, etc.). A "y2p" file (computer text file), which is a tabular representation of data, may be used. In certain configurations, in the "y2p" file, the first column is the frequency ("freq"), and the remaining columns are Y parameters in real and imaginary formats. Specifically, the second column is "reY11" for real, parameter Y11; the third column is "imY11" for imaginary, parameter Y11; the fourth column is "reY21" for real, parameter Y21; the fifth column is "imY21" for imaginary, parameter Y21; the sixth column is "reY12" for real, parameter Y12; the seventh column is "imY12" for imaginary, parameter Y12; the eight column is "reY22" for real, parameter Y22; and the ninth column is "imY22" for imaginary, parameter Y22. It is noted that not all of the columns and rows are shown in FIG. 3.

In one embodiment, this information may be loaded into a function generator that has been developed to take the input file and generate the correct mathematical representation for loading onto the oscilloscope. The y2p file is selected as input, and the rational fit created by generating the proper fit to the data to obtain the Y-parameters. Looking at magnitude and phase for one Y-parameter, it may be observed that there are differences at very high frequencies (above approximately $10^6$ Hz) where the model data and rational fit data differ, but this divergence may occur at frequencies that are higher than the frequencies of interest for the DUT.

Figure 7:
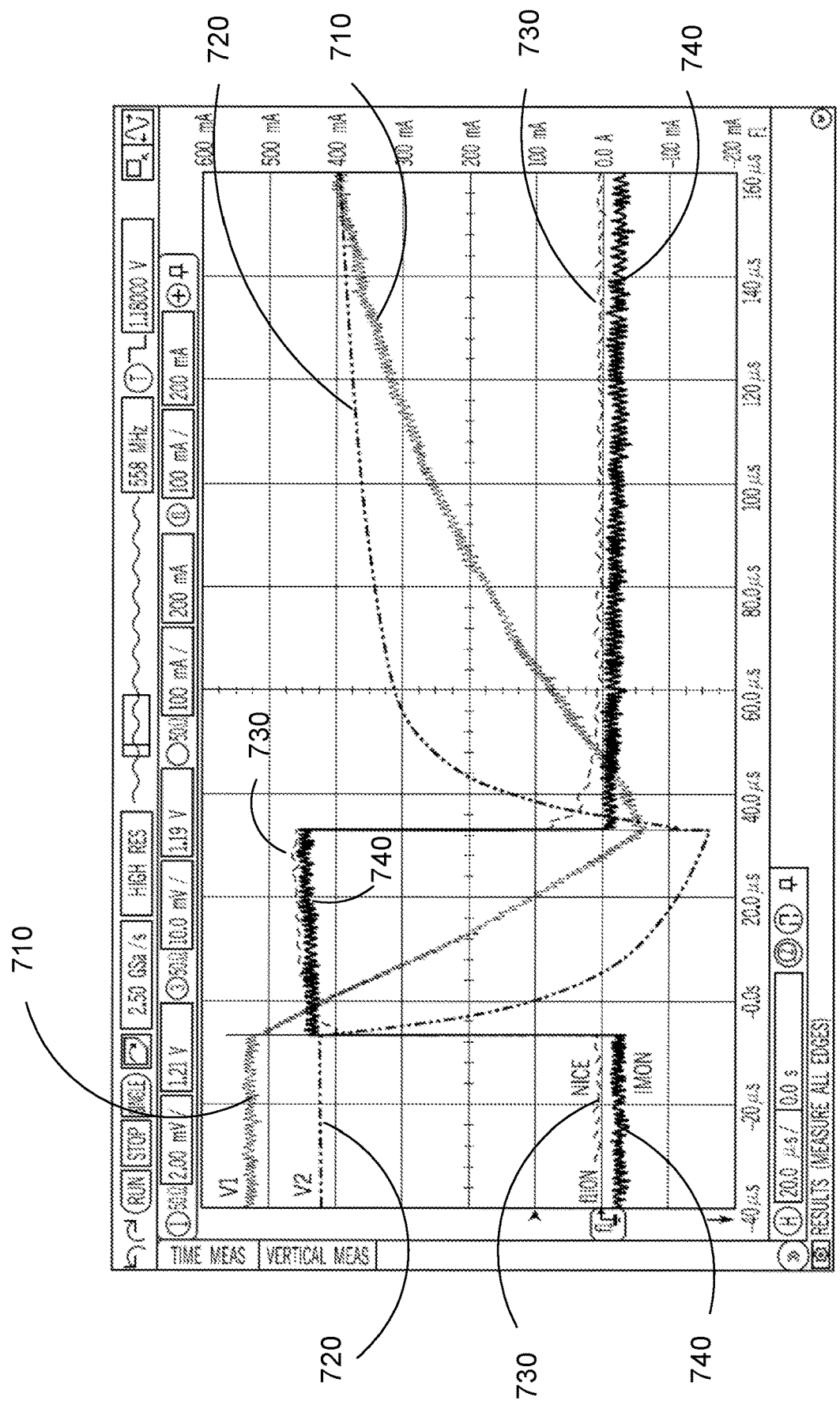
FIG. 7 is a graphical representation of an output from one example embodiment of the disclosure.
Figure 9:
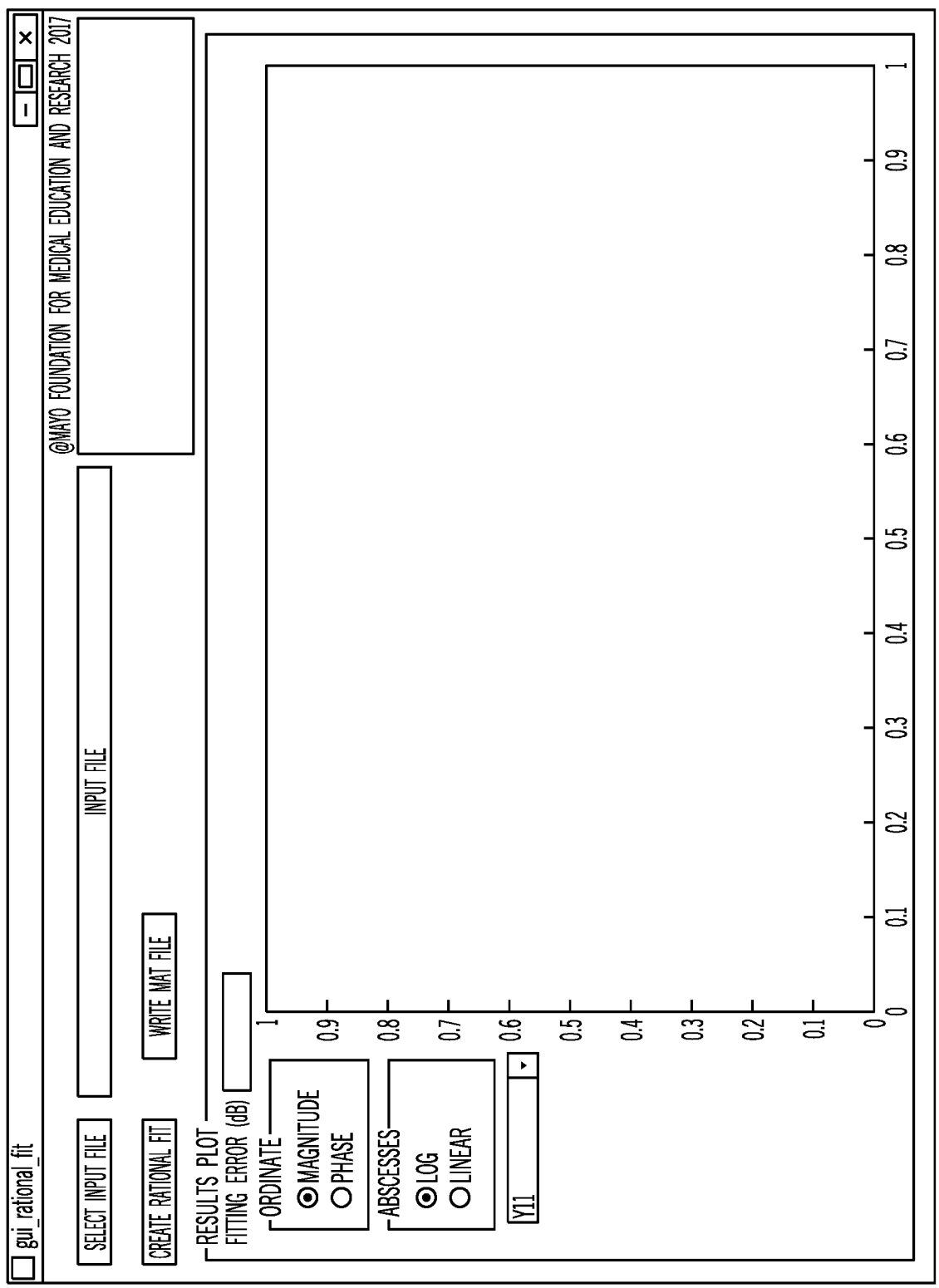
FIG. 9 depicts an example output from one embodiment of the disclosure.
Figure 10:
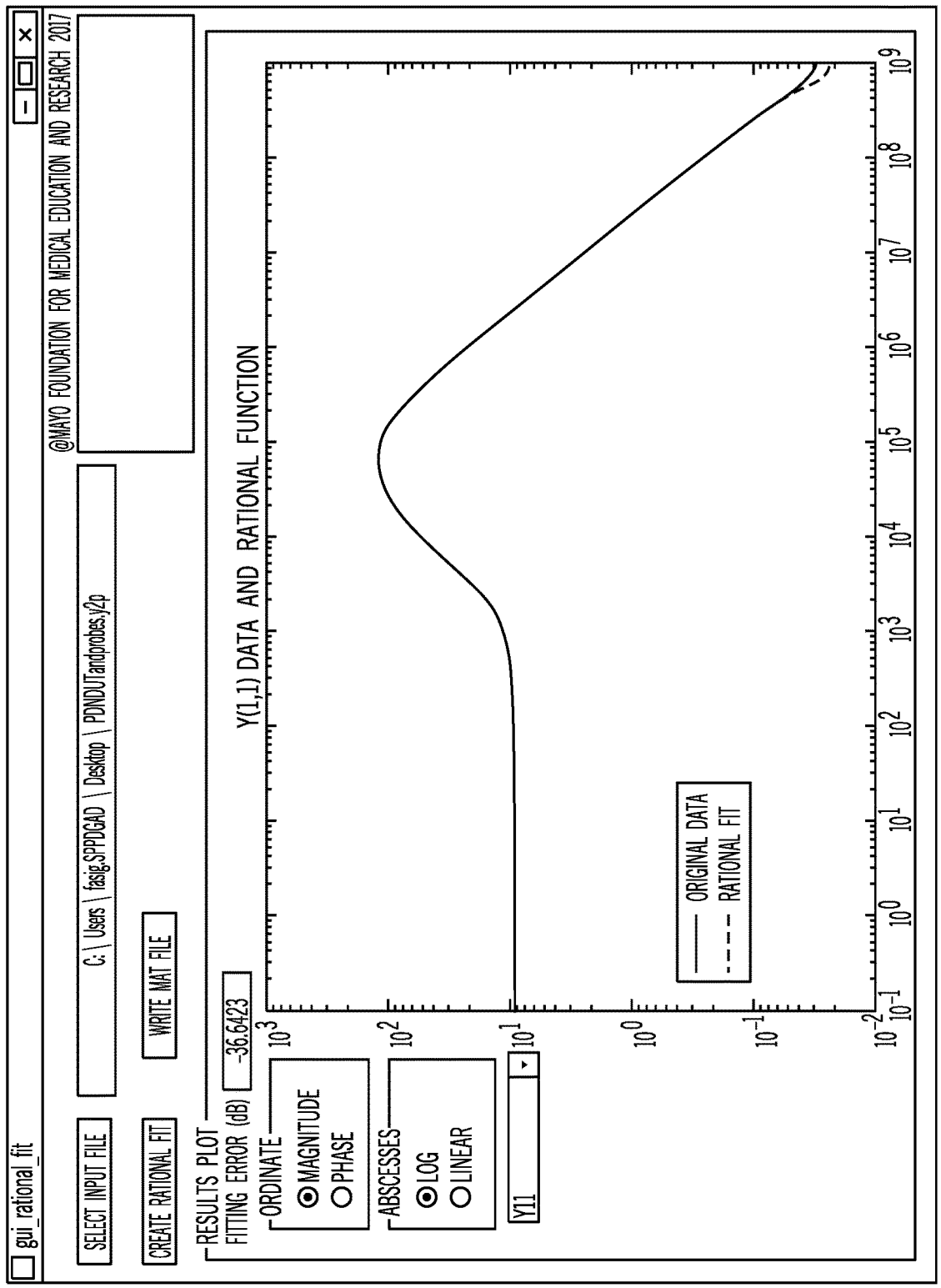
FIG. 10 depicts an example output from one embodiment of the disclosure.
Figure 11:
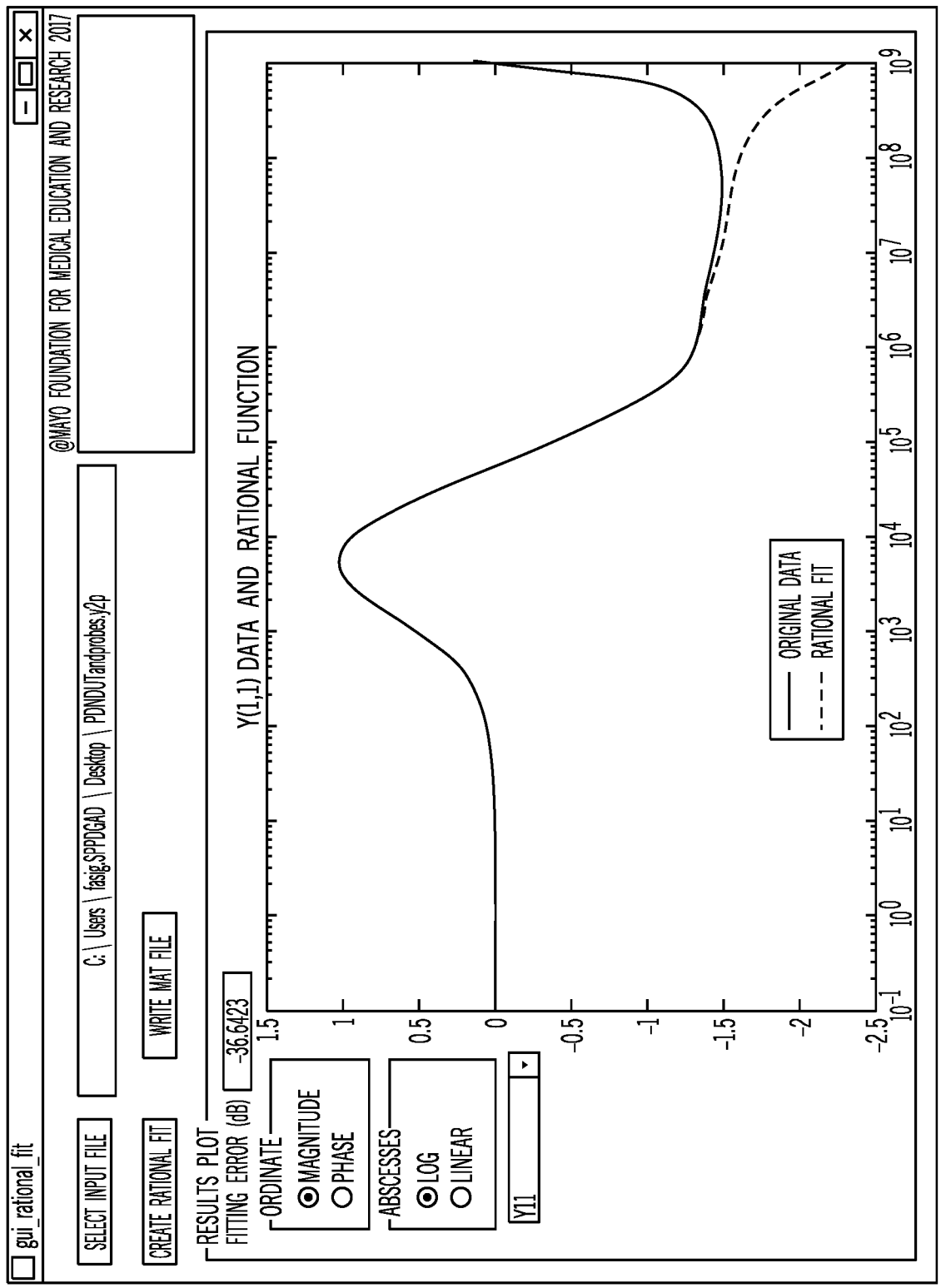
FIG. 11 depicts an example output from one embodiment of the disclosure.
Figure 12:
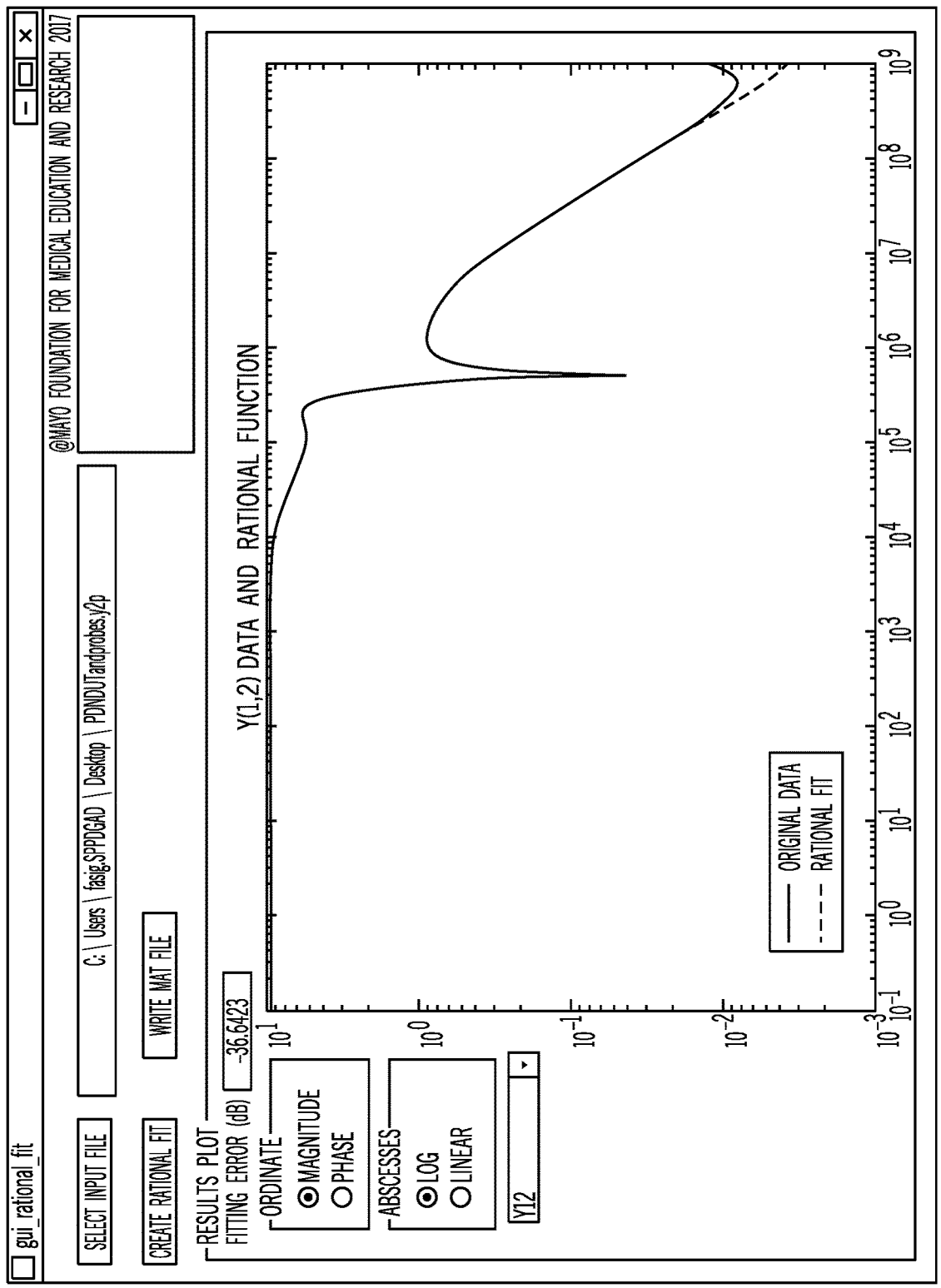
FIG. 12 depicts an example output from one embodiment of the disclosure.
Figure 13:
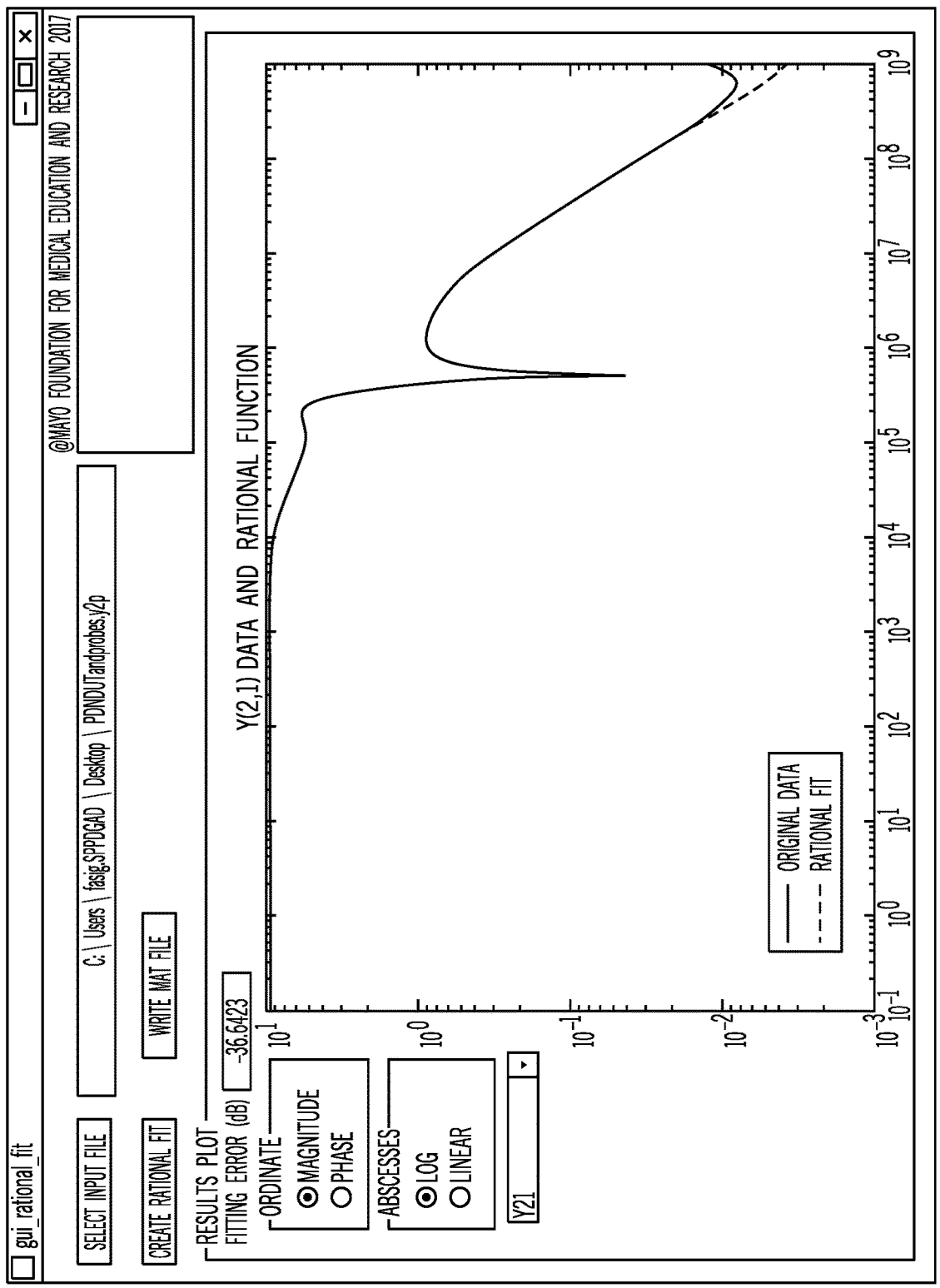
FIG. 13 depicts an example output from one embodiment of the disclosure.
Figure 14:
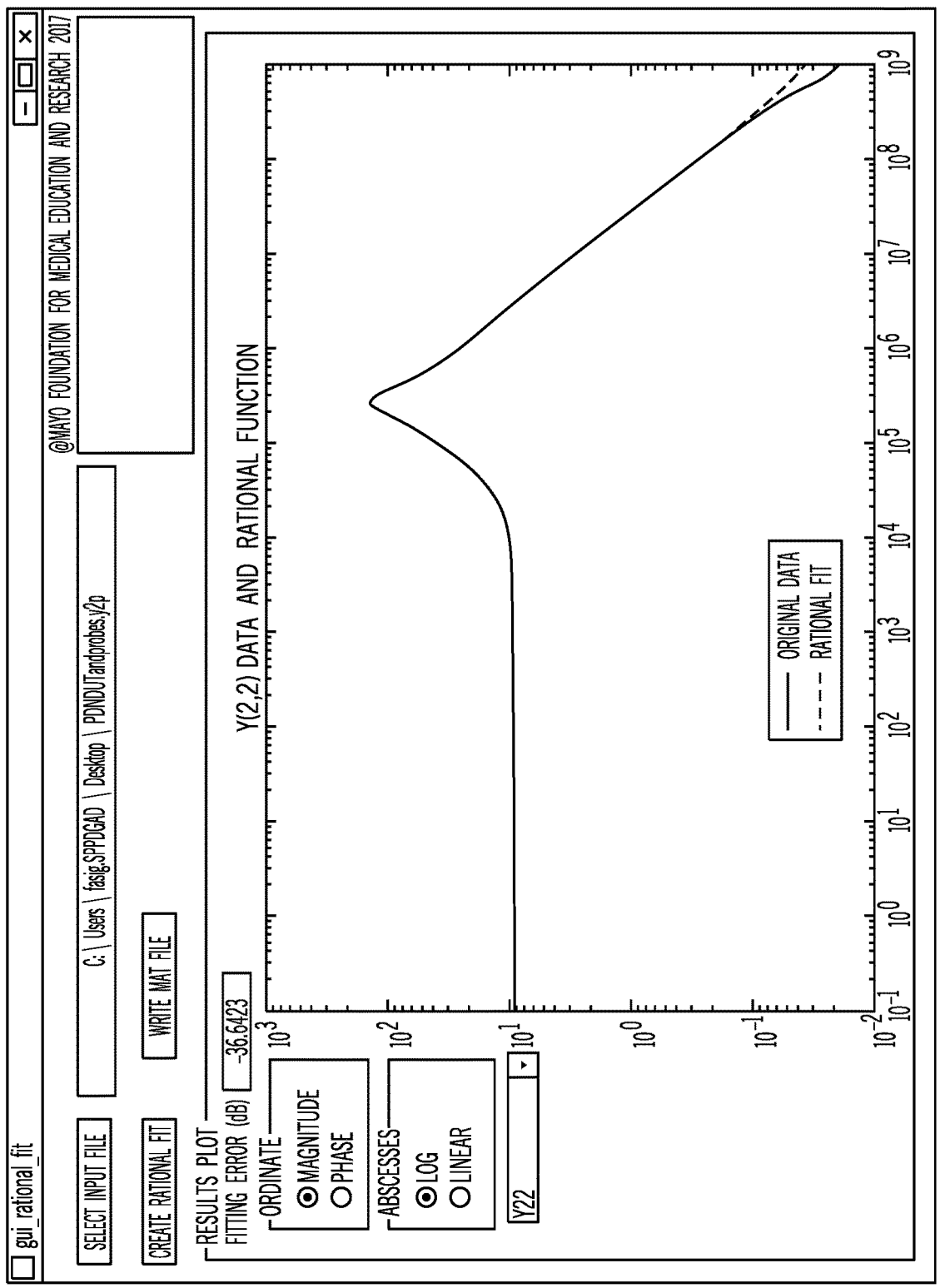
FIG. 14 depicts an example output from one embodiment of the disclosure.
Figure 15:
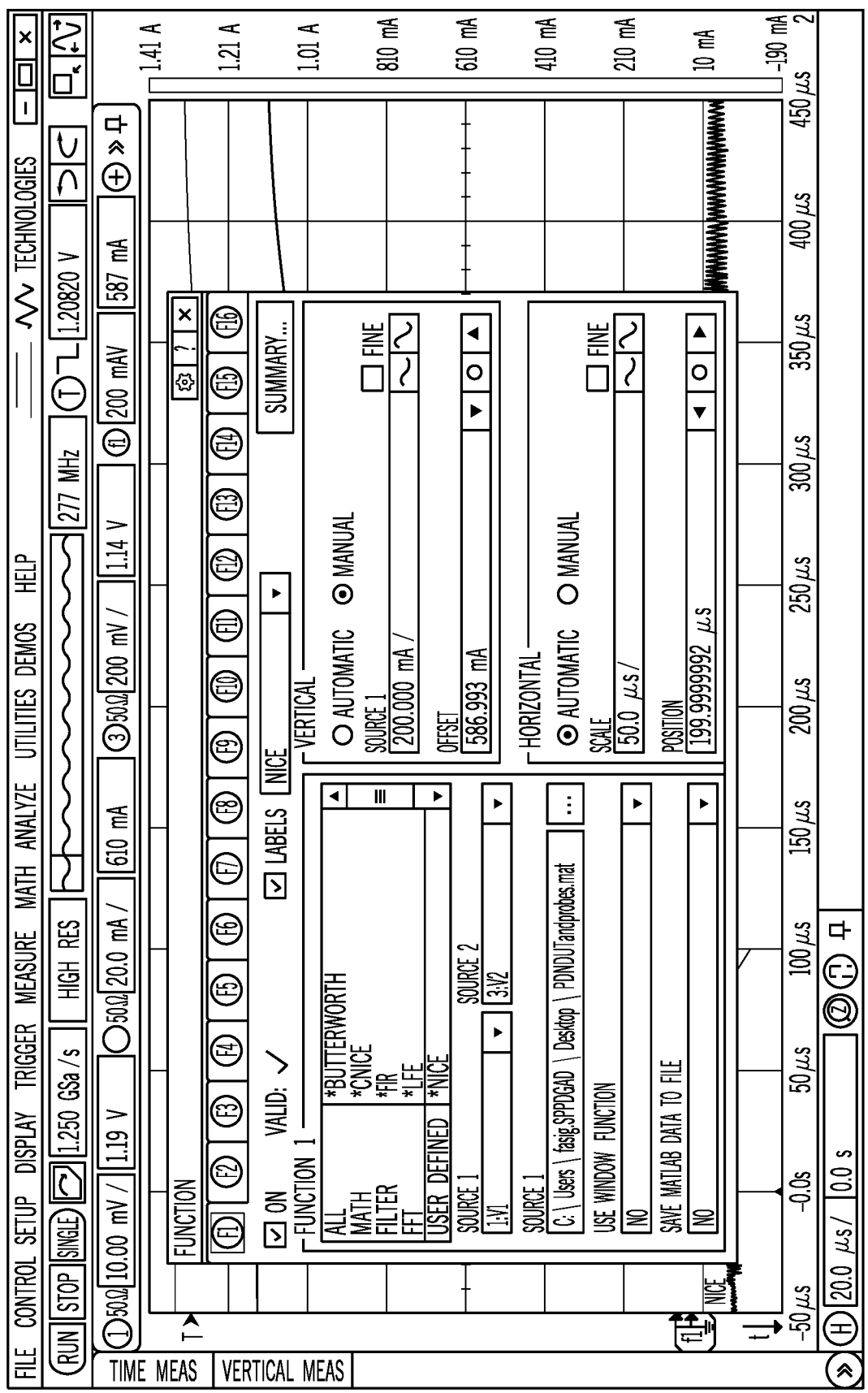
FIG. 15 depicts an example interface of an oscilloscope from one embodiment of the disclosure.
Figure 16:
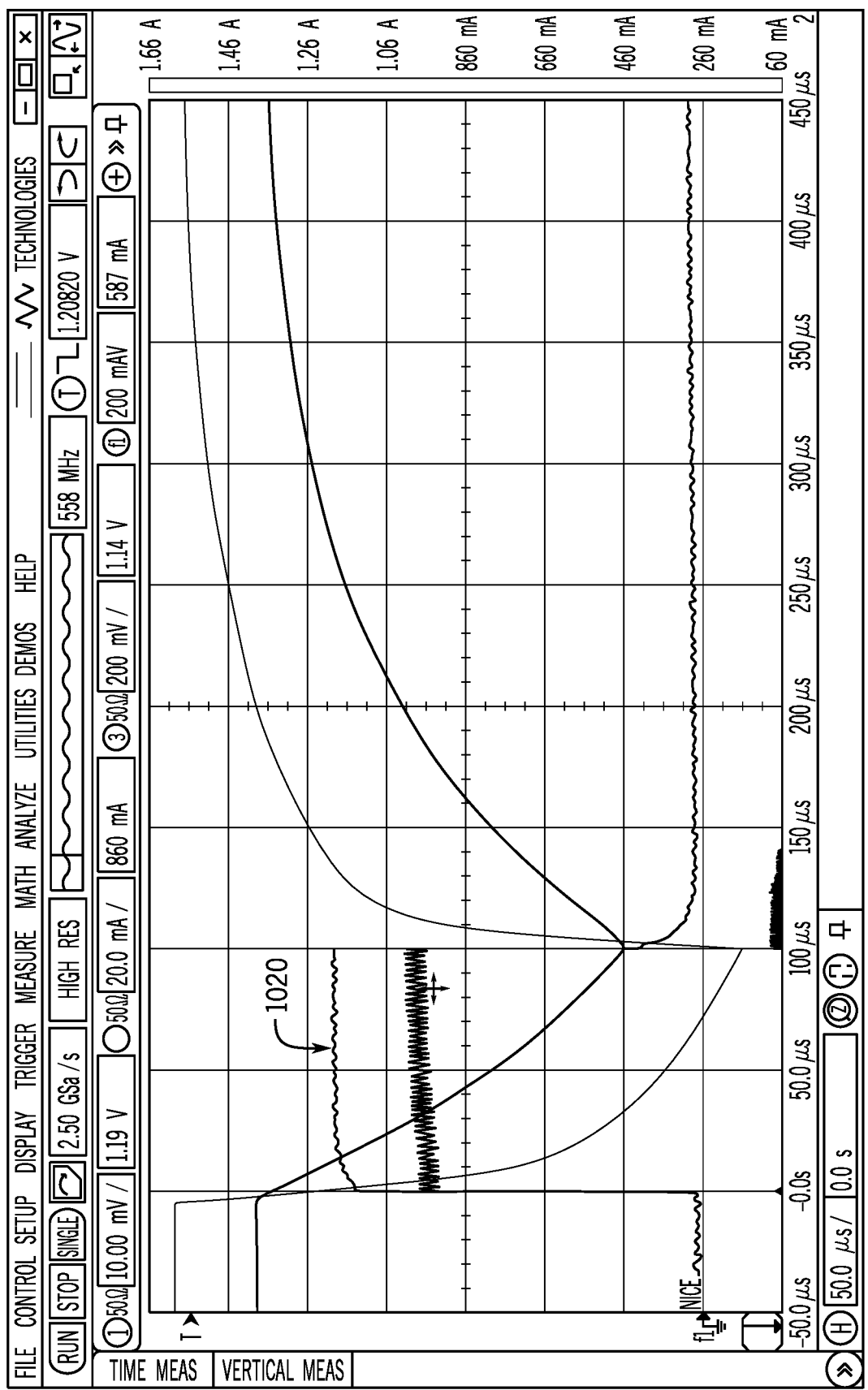
FIG. 16 is a graphical representation of an output from one example embodiment of the disclosure.

Referring now to FIG. 7, an example oscilloscope display is shown where the rational-fit function may be written to a file that the oscilloscope can use (e.g., a MAT file, in certain configurations) and saved. Using the oscilloscope, a load voltage waveform 720, a regulator input voltage waveform 710, the results of the NICE current model 730, and monitor current 740 driven into the DUT 105 may be displayed. The ordinarily unknown actual current, denoted here as monitor current 740, may be displayed as a way to allow direct comparison between the actual current to the NICE model current 730. In this example, the excellent agreement between the NICE-current 730 and monitor-current 740 waveforms demonstrates the validity of the NICE method when accurate admittance parameters are used. A report to a user may be in the form of an oscilloscope display, such as shown here.

The voltage waveforms on the oscilloscope may be displayed by adjusting the sampling rate to not be greater than twice the maximum bandwidth modeled in the network parameters. While the NICE algorithm will support any sampling rate, the rational fit may be limited in some embodiments to being conducted over the range of frequencies supplied in the network parameters. Thus, the relationship beyond this range between the network parameters and the rational model is unknown. The waveform capture depth may be adjusted to be as long as necessary to represent the event of interest. The longer the captured waveform the more time it will take the processing to complete. The captured waveforms should be long enough so that a steady state exists at the beginning and the end of the desired event. If this is not possible, some stable or quiet voltage levels are sufficient to minimize numerical anomalies. Also, single sweep may be run using either trigger event or a single automatic trigger via the control panel. If the sweeps are continuous, the oscilloscope may grind to a halt due to the processing required by the intensive computations that are running repeatedly In one embodiment, the calculated current may be displayed in comparison to the actual current. If the function is run again, the oscilloscope captures a new current waveform for each voltage and the function map is run by the oscilloscope in the background and plotted.

Under the functions of the oscilloscope, the math functions that are acted upon by measured waveforms can be plotted. Custom NICE code can be used to take regulator voltage as input, load voltage as output, and the NICE model for calculating current. That is, the model is run in the background, and the plot displayed on a screen. Each time trigger is set up so that a new set of waveforms is captured (the oscilloscope captures the waveform and reruns the math to provide the displayed waveforms. The waveforms can then be saved using the oscilloscope's built-in save feature.

It is noted that in this example, the oscilloscope is being regularly triggered and updated, for example, at a certain frequency (such as about once (or more often) each second). The calculation can thus be run in real time; with each oscilloscope trigger (i.e., each event in which the waveforms are measured by the oscilloscope), the oscilloscope recalculates in real time and plots the waveforms so the differences can be observed. If the current waveform is changed, the calculated waveform also changes.

As discussed, time-domain current waveforms may be precisely determined from two simultaneous voltage measurements. The voltage waveforms may be captured using a digital oscilloscope without current-sense resistors or current probes. With careful component and board modeling, it is possible to calculate current waveforms with a root mean square error of less than five percent compared to the reference measurement. Current transients that were previously difficult or impossible to characterize by any means can now be calculated and displayed within seconds of an oscilloscope-trigger event by using the discussed NICE approach. The NICE technique may work for any transient event that can be captured on a digital oscilloscope.

Current-waveform estimation is especially relevant for power delivery network and regulator designers who must ensure that a supply exhibits tight voltage tolerances when little is known about the magnitude and timing of load-current transients. Applications of the described method include characterization of supply-current transients for large active devices, or wherever the use of series sense-resistors and current probes are impractical such as when extensive decoupling networks are involved. ASIC and FPGA manufacturers, for example, can now compute the start-up current for their devices and publish the actual waveform or provide a piecewise-linear SPICE model (PWL source) to facilitate design and testing of the regulator and PDN required to support their devices.

NICE may be applied by, for example: PDN designers needing current waveforms to ensure that the load-voltage tolerances are obeyed; and power-supply designers needing current waveforms to ensure that the components do not burn up when the supply is loaded. Exemplary implementations of NICE are applicable to any circuit where current waveforms are of interest and sense-resistors or current probes cannot be used. Examples include industrial motor controls, electric vehicles, power amplifiers, wireless battery chargers, and solar power inverters. New technologies such as gallium-nitride semiconductors switch faster and will exacerbate the problem of measuring current when extra circuit resistance or inductance cannot be tolerated. NICE offers relief and enables real-time current display.

The present invention has been described in terms of one or more example embodiments, and it should be appreciated that many equivalents, alternatives, variations, additions, and modifications, aside from those expressly stated, and apart from combining the different features of the foregoing embodiments in varying ways, can be made and are within the scope of the invention. In the above description, a number of specific details, examples, and scenarios are set forth in order to provide a better understanding of the present disclosure. These examples and scenarios are provided for illustration, and are not intended to limit the disclosure in any way. The true scope of the invention will be defined by the claims included in any later-filed utility patent application claiming priority from this provisional patent application.

Those of ordinary skill in the art, with the included descriptions, will be able to implement appropriate functionality without undue experimentation. References in the specification to an "embodiment," an "example," a "version," an "implementation," a "configuration," an "instance," etc., indicate that the embodiment, example, version, etc. described may include one or more particular features, structures, or characteristics, but not every embodiment, example, version, etc. necessarily incorporates the particular features, structures, or characteristics. Further, when a particular feature, structure, or characteristic is described in connection with an embodiment, it is believed to be within the knowledge of one skilled in the art to effect such feature, structure, or characteristic in connection with other embodiments whether or not explicitly indicated.

The computerized functionality described above may be implemented in hardware, firmware, software, single integrated devices, multiple devices in wired or wireless communication, or any combination thereof. Computerized functions may be implemented as instructions stored using one or more machine-readable media, which may be read and executed by one or more processors. A machine-readable medium may include any mechanism for storing or transmitting information in a form readable by a machine. For example, a machine-readable medium may include any suitable form of volatile or non-volatile memory. In the drawings, specific arrangements or orderings of schematic elements may be shown for ease of description. However, the specific ordering or arrangement of such elements is not meant to imply that a particular order or sequence of processing, or separation of processes, is required in all embodiments. Further, some connections or relationships between elements may be simplified or not shown in the drawings so as not to obscure the disclosure. This disclosure is to be considered as providing examples and not being restrictive in character, and all changes and modifications that come within the spirit of the disclosure are desired to be protected and within the scope of invention.

The invention claimed is:

1. A method for non-invasively estimating current drawn by a device under test (DUT), the method comprising:
   a) measuring first and second voltages using first and second test probes electrically connected to the DUT, wherein the first test probe is connected at a current source, and wherein the second test probe is connected at a load in the DUT, the load configured to draw current from the current source;
   b) generating empirical frequency data for the DUT based on the first and second voltages measured over a selected range of frequencies;
   c) generating a current estimation model by fitting a function to the empirical frequency data; and
   d) creating a report of the current drawn by the DUT, wherein data contained in the report enables a user to perform at least one of redesigning, rebuilding, testing, or debugging the DUT, wherein the function is selected to be a rational function configured to facilitate said creating the report in a time domain, and wherein the rational function is a rational vector fitting function wherein a current from the current estimation model is calculated from the empirical frequency data using an admittance matrix wherein each element of the admittance matrix is of the form:

$$f(s) = \sum_{n=1}^{N} \frac{c_n}{s - a_n} + d + s \times h$$

wherein $a_n$ represents rational function poles, $c_n$ represents residues, d is a constant that represents a fixed amount of time delay, and h is a pole-opposite zero.

2. The method of claim 1, wherein said creating the report includes displaying the report of the current drawn by the DUT in real-time while the first and second probes are measuring the first and second voltages.

3. The method of claim 1, further comprising acquiring time-domain voltage waveforms with the first and second test probes.

4. The method of claim 1, further comprising positioning the first test probe at a voltage regulator and positioning the second test probe at the load in the DUT.

5. The method of claim 1, wherein step a) includes measuring a plurality of voltages using a plurality of probes electrically connected to the DUT.

6. A method for non-invasively estimating current drawn by a device under test (DUT), the method comprising:
   a) assessing first and second voltages at first and second test locations that are simulated as electrically connected to the DUT, wherein the first test location is located at a current source, and wherein the second test location is located at a load in the DUT that is configured to draw current from the current source:
   b) generating simulated frequency data for the DUT by estimating the first and second voltages over a selected range of frequencies;
   c) generating a current estimation model by fitting a function to the simulated frequency data; and
   d) creating a report of the current drawn by the DUT wherein data contained in the report enables a user to perform at least one of redesigning, rebuilding, testing, or debugging the DUT, wherein the function is selected to be a rational function configured to facilitate said creating the report in a time domain, wherein the rational function is a rational vector fitting function wherein a current from the current estimation model is calculated from the simulated frequency data using an admittance matrix wherein each element of the admittance matrix is of the form:

$$f(s) = \sum_{n=1}^{N} \frac{c_n}{s - a_n} + d + s \times h$$

wherein $a_n$ represents rational function poles, $c_n$ represents residues d is a constant that represents a fixed amount of time delay, and h is a pole-opposite zero.

7. The method of claim 6, wherein said creating the report includes displaying the report of the current drawn by the DUT in real-time.

8. The method of claim 6, wherein the assessing includes modeling a plurality of voltages using a plurality of simulated probe locations connected to the DUT.

9. A method for non-invasively estimating current drawn by a device under test (DUT), the method comprising:
   a) measuring current between first and second test locations using first and second test probes electrically connected to the DUT, wherein the first test probe is connected at a current source, and wherein the second test probe is connected at a load in the DUT, the load configured to draw current from the current source:
   b) generating empirical frequency data for the DUT based on the current between the first and second test locations measured over a selected range of frequencies;
   c) generating a current estimation model by fitting a function to the empirical frequency data; and
   d) creating a report of the current drawn by the DUT wherein data contained in the report enables a user to perform at least one of redesigning, rebuilding, testing, or debugging the DUT, wherein the function is selected to be a rational function configured to facilitate said creating the report in a time domain, wherein the rational function is a rational vector fitting function wherein a current from the current estimation model is calculated from the simulated frequency data using an admittance matrix wherein each element of the admittance matrix is of the form:

$$f(s) = \sum_{n=1}^{N} \frac{c_n}{s - a_n} + d + s \times h$$

wherein $a_n$ represents rational function poles, $c_n$ represents residues d is a constant that represents a fixed amount of time delay, and h is a pole-opposite zero.

10. The method of claim 9, wherein said creating the report includes displaying the report of the current drawn by the DUT in real-time.

11. The method of claim 9, further comprising positioning the first test probe at a voltage regulator and positioning the second test probe at the load in the DUT.

12. The method of claim 9 wherein step a) includes measuring a plurality of currents using a plurality of probes electrically connected to the DUT.

13. A method for non-invasively estimating current drawn by a device under test (DUT), the method comprising:
   a) assessing current between first and second test locations that are simulated as electrically connected to the DUT, wherein the first test location is located at a current source, and wherein the second test location is located at a load in the DUT that is configured to draw current from the current source;
   b) generating simulated frequency data for the DUT by estimating the current between the first and second test locations over a selected range of frequencies;
   c) generating a current estimation model by fitting a function to the simulated frequency data; and
   d) creating a report of the current drawn by the DUT wherein data contained in the report enables a user to perform at least one of redesigning, rebuilding, testing, or debugging the DUT, wherein the function is selected to be a rational function configured to facilitate said creating the report in a time domain, wherein the rational function is a rational vector fitting function wherein a current from the current estimation model is calculated from the simulated frequency data using an admittance matrix wherein each element of the admittance matrix is of the form:

$$f(s) = \sum_{n=1}^{N} \frac{c_n}{s - a_n} + d + s \times h$$

wherein $a_n$ represents rational function poles, $c_n$ represents residues d is a constant that represents a fixed amount of time delay, and h is a pole-opposite zero.

14. The method of claim 13, wherein said creating the report includes displaying the report of the current drawn by the DUT in real-time.

15. The method of claim 13, wherein the assessing includes modeling a plurality of currents using a plurality of simulated probe locations connected to the DUT.

* * * * *

UNITED STATES PATENT AND TRADEMARK OFFICE
CERTIFICATE OF CORRECTION

| | | |
|---|---|---|
| PATENT NO. | : 11,300,616 B2 | Page 1 of 1 |
| APPLICATION NO. | : 16/629518 | |
| DATED | : April 12, 2022 | |
| INVENTOR(S) | : Jonathan L. Fasig et al. | |

It is certified that error appears in the above-identified patent and that said Letters Patent is hereby corrected as shown below:

In the Specification

Column 6, Line 39, "Gustaysen" should be --Gustavsen--.

Column 6, Line 43, "ieeexploreleee.org" should be --ieeexplore.ieee.org--.

Signed and Sealed this
Twenty-fifth Day of June, 2024

*Katherine Kelly Vidal*

Katherine Kelly Vidal
*Director of the United States Patent and Trademark Office*